United States Patent
Lee et al.

(10) Patent No.: US 9,076,523 B2
(45) Date of Patent: Jul. 7, 2015

(54) METHODS OF MANUFACTURING EMBEDDED BIPOLAR SWITCHING RESISTIVE MEMORY

(71) Applicant: Intermolecular, Inc., San Jose, CA (US)

(72) Inventors: Mankoo Lee, Fremont, CA (US); Tony Chiang, Campbell, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 217 days.

(21) Appl. No.: 13/714,173

(22) Filed: Dec. 13, 2012

(65) Prior Publication Data

US 2014/0169062 A1    Jun. 19, 2014

(51) Int. Cl.
*G11C 13/00* (2006.01)

(52) U.S. Cl.
CPC ........ *G11C 13/0033* (2013.01); *G11C 13/0002* (2013.01); *G11C 13/003* (2013.01); *G11C 13/0007* (2013.01); *G11C 13/0069* (2013.01); *G11C 2213/72* (2013.01); *G11C 2213/76* (2013.01); *G11C 2213/77* (2013.01); *G11C 2213/79* (2013.01)

(58) Field of Classification Search
CPC ........... G11C 13/0002; G11C 13/0033; G11C 2213/70; G11C 2213/71; G11C 2213/72; G11C 2213/74; G11C 2213/76; G11C 2213/79
USPC .................... 365/148, 175, 187, 72
See application file for complete search history.

(56) References Cited

U.S. PATENT DOCUMENTS

| | | | |
|---|---|---|---|
| 4,622,575 A | 11/1986 | Vora et al. | |
| 6,141,241 A * | 10/2000 | Ovshinsky et al. | 365/163 |
| 7,035,141 B1 * | 4/2006 | Tripsas et al. | 365/175 |
| 7,368,314 B2 | 5/2008 | Ufert | |
| 7,646,626 B2 * | 1/2010 | Parkinson et al. | 365/148 |
| 7,655,939 B2 | 2/2010 | Ufert | |
| 8,117,508 B2 * | 2/2012 | Tokiwa | 714/704 |
| 8,203,863 B2 * | 6/2012 | Kim et al. | 365/148 |
| 8,289,746 B2 * | 10/2012 | Chen et al. | 365/66 |
| 8,335,100 B2 * | 12/2012 | Liu et al. | 365/148 |
| 8,748,934 B2 * | 6/2014 | Pan et al. | 257/107 |
| 2008/0014448 A1 | 1/2008 | Lu et al. | |
| 2011/0001169 A1 * | 1/2011 | Ozcan et al. | 257/213 |

OTHER PUBLICATIONS

Chang, MF., et al.; A 0.5V 4Mb Logic-Process Compatible Embedded Resistive RAM (ReRAM) in 65nm CMOS Using Low-Voltage Current-Mode Sensing Scheme with 45ns Random Read Time; 2012; IEEE; IEEE Inernational Solid-State Circuits Conference; 3 pages.

(Continued)

*Primary Examiner* — Vanthu Nguyen

(57) ABSTRACT

Non linear current response circuits can be used in embedded resistive memory cell for reducing power consumption, together with improving reliability of the memory array. The non linear current response circuits can include two back to back leaky PIN diodes, two parallel anti-directional PIN diodes, two back to back Zener-type metal oxide diodes, or ovonic switching elements, along with current limiting resistor for standby power reduction at the low voltage region. Also, the proposed embedded ReRAM implementation methods based upon 1T2D1R scheme can be integrated into the advanced FEOL process technologies including vertical pillar transistor and/or 3D fin-shaped field effect transistor (FinFET) for realizing a highly compact cell density.

14 Claims, 23 Drawing Sheets

(56) References Cited

OTHER PUBLICATIONS

Lee H.Y., et al.; Low Power and High Speed Bipolar Switching with a Thin Reactive Ti Buffer Layer in Robust HfO2 Based RRAM; 2008; IEEE; 4 pages.

Strenz, Robert; Embedded Flash Technologies and their Applications: Status & Outlook; 2011; IEEE; pp. 9.4.1-9.4.4.

Wei, Z., et al.; Highly Reliable TaOx ReRAM and Direct Evidence of Redox Reaction Mechanism; 2008; IEEE; 4 pages.

Kawahara, A., et al.; An 8Mb Multi-Layered Cross-Point ReRAM Macro with 443MB/s Write Throughput; 2012; IEEE; IEEE International Solid-State Circuits Conference; 3 pages.

* cited by examiner

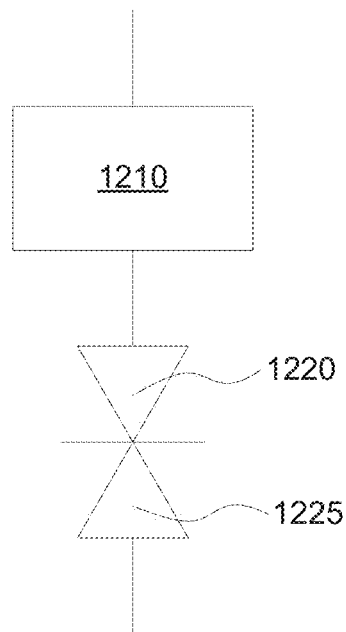
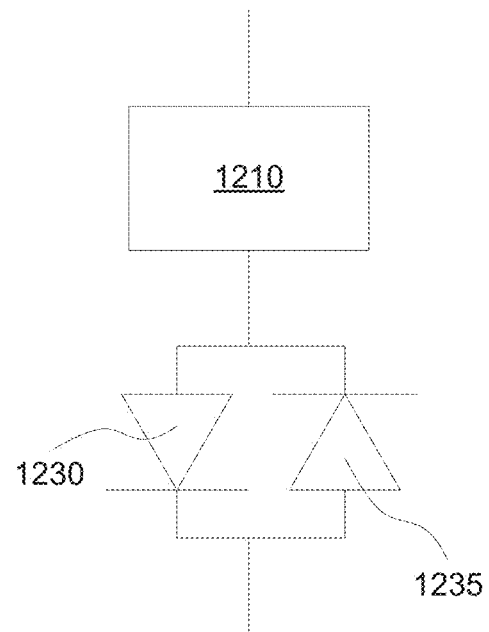
*FIG. 12A*
*FIG. 12B*
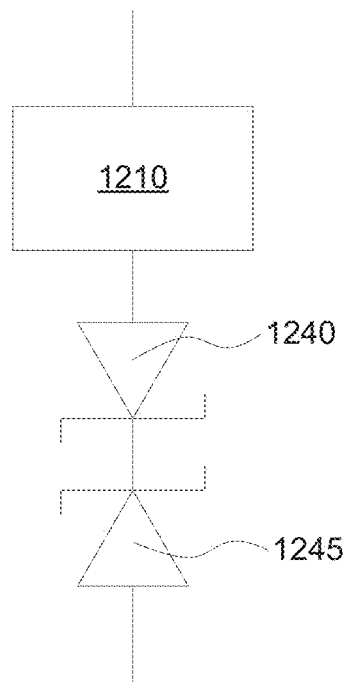
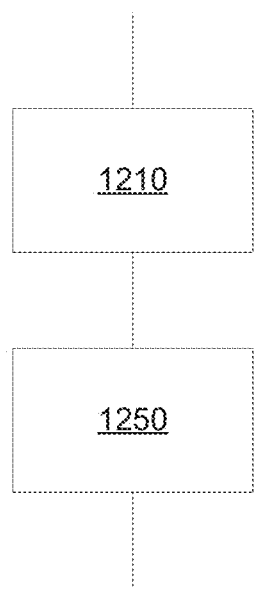
*FIG. 12C*
*FIG. 12D*

METHODS OF MANUFACTURING EMBEDDED BIPOLAR SWITCHING RESISTIVE MEMORY

FIELD OF THE INVENTION

This invention relates generally to nonvolatile memory elements, and more particularly, to methods for forming resistive switching memory elements used in nonvolatile memory devices

BACKGROUND

Electrically-erasable programmable read only memory ($E^2$PROM), silicon oxide nitride oxide silicon (SONOS) and/or metal oxide nitride oxide silicon (MONOS) based embedded non volatile memory technologies mostly require larger chip area, higher voltage operation, and more process mask layers compared to the recent emerging resistive memory (ReRAM) technology. As emerging ReRAM technology is advanced towards robust reliability (endurance and retention) and high performance (speed and power) by a better selection of transition metal oxide and its switching device, it could be a potential candidate to consider an embedded ReRAM implementation into recent nano meter logic technologies, and/or manufacturing deep submicron CMOS production nodes due to its superior scalability.

Compared to silicon on insulator (SOI) based embedded DRAM having high density and fast access time, the embedded ReRAM can be a potential candidate due to a simple cell scalability advantage with only 3-4 extra masks and less process complexity due to self-alignment process.

Resistive memory device, e.g., resistive switching nonvolatile random access memory is formed using memory elements that have two or more stable states with different resistances. Bistable memory has two stable states. A bistable memory element can be placed in a high resistance state (HRS) or a low resistance state (LRS) by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense.

Therefore, there is a need for a ReRAM design that can meet the design criteria for advanced memory devices.

SUMMARY

In some embodiments, methods and systems for a non linear reduction of current passing through a memory element are provided. At low voltages, e.g., lowering than the operating voltages, the current can be significantly reduced, while the current can remain the same or can also be reduced, but at a much less degree, to improve reliability while still ensuring proper operation of the memory devices. The lower current values can reduce power consumption and thus improving the power efficiency of the memory arrays.

In some embodiments, methods and systems for optimizing the current response of a memory element are provided. By connecting a non linear current-voltage (IV) response device in series to a resistive memory element, the current response of the memory element can be modified, for example, to reduce the leakage current at low voltages and to optimize the current at the operating voltages.

The non linear IV response circuit can have low current gain at low voltages and high current gain at high voltages. The non linear IV response circuit can include two leaky PIN diodes connected back to back. The non linear IV response circuit can include two PIN diodes connected in parallel. The non linear IV response circuit can include two Zener-type metal oxide diodes connected back to back. The non linear IV response circuit can include other circuitry that can provide a non linear response behavior, such as an ovonic switching device.

The memory device including a memory element and a non linear response circuit can be used in a memory array, such as a cross point array. A transistor selector can be used for memory device isolation. The memory devices and the memory array can be fabricated during front end of line (FEOL) process for the embedded ReRAM mixed signal chips.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 12A-12D illustrate examples of non linear IV response circuits according to some embodiments.

DETAILED DESCRIPTION

Figure 1A:
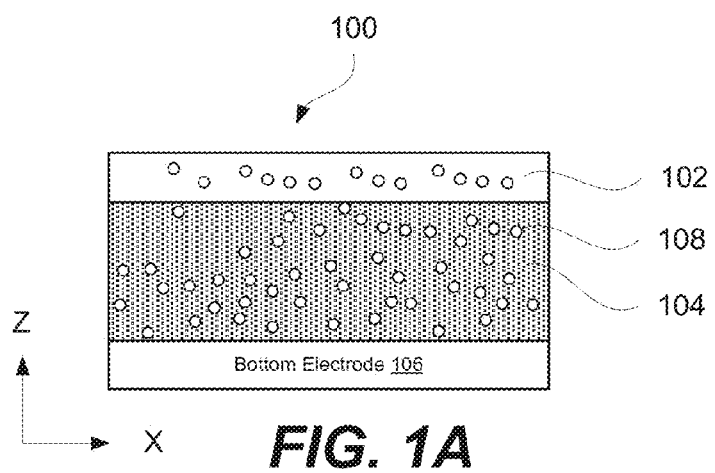
FIGS. 1A-1C illustrate a schematic representation of a ReRAM cell operation according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, ReRAM cells can be implemented into FEOL process for embedded memory applications. The implementation can be performed using an appropriate transistor selector connected to a word line to disconnect unselected cells and/or arrays. Bidirectional switching diodes or two-side threshold switching devices can be further added to help to reduce cell leakage currents in the low voltage range. At the same time, the $I_{on}/I_{off}$ ratio can be improved while keeping similar programming current levels of ReRAM stack at $V_{set}$ and $V_{reset}$ during the conduction filament transitions.

In some embodiments, the overall memory array leakage can be reduced by the use of bidirectional switching devices, especially when byte or page programming is performed through multiple cell selection. In some embodiments, bidirectional switching can be made by placing parallel PIN/NIP or PN/NP diodes to transition metal oxide ReRAM cells based stack during the front end of line (FEOL) process, which relates to fabrication processes at the transistor level, before the fabrication of metal line interconnection. Furthermore the metallic switching device serially connected to the memory stack can be developed with a high productivity combinatorial (HPC) material selection for an optimized ReRAM cell solution.

In some embodiments, the embedded bipolar switching ReRAM cell implementation can include 1T2D(leaky)1R or 1T2D(non leaky)1R schemes for improving performance. The ReRAM cell can be fabricated with optionally lateral, vertical, or hybrid type selector transistor in the existing logic CMOS, SOI-based embedded DRAM, or bulk FinFET based SRAM technology, respectively.

In some embodiments. the embedded chip size can be reduced substantially by using a vertically integrated transition metal oxide based ReRAM. Since a lagged embedded non volatile technology (e.g, CMOS 0.35 µm node) does not require an extremely small cell like embedded DRAM case, a single high voltage selector transistor in the bit cell unit can be used to stop a sneak current path in unselected memory arrays. It also can protect the core memory element of the memory stack for a possible high voltage programming during mixed signal chip operations. In addition, low cost bidirectional threshold switching devices can be integrated into ReRAM memory cell structure to further reduce programming leakage at the low voltage operation.

In addition to bidirectional threshold switching devices such as ovonic threshold switching (OTS) devices, the chip size can also be reduced by using low cost parallel or serial diode configurations. In some embodiments, the diodes can be intentional leaky diodes, the diodes might not need to be operated in the reverse bias region. Thus the diodes can be PN diodes instead of PIN diodes, e.g., without an intrinsic layer (i or π region).

In some embodiments, methods of manufacturing embedded bipolar switching resistive memory for a future embedded ReRAM solution in the invention are provided, including 12 configurations for 3 selectors and 4 switching devices.

In some embodiments. methods are provided to enable transition metal oxide, e.g. $HfO_2$, $Al_2O_3$, $ZrO_2$ etc., including non-stoichiometric, doped, stacked, nanolaminated, etc., based bipolar switching ReRAM implementation with 1T1D1(or 2D)R1 schemes for high reliable non volatile mixed signal chips in the current embedded memory technologies.

In some embodiments, since it includes an ideal bidirectional switching device vertically integrated with core memory MIM stack, the proposed embedded ReRAM realization can be integrated in FEOL process, as well as for a stand-alone ReRAM integration into BEOL process without any significant sneak current paths in possible 3D crossbar interconnect architectures.

In some embodiments, methods and circuits are proposed for implementing ReRAM cells by 1T1D (or 2D)1R schemes having reliable metal oxide based ReRAM memory stack, bidirectional switching diode, and selector transistor. The full manufacturing option for a reliable embedded ReRAM chip can be integrated into FEOL (not BEOL) process.

A ReRAM cell exhibiting resistive switching characteristics generally includes multiple layers formed into a stack.

The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrodes. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

Methods of forming nonvolatile memory elements can involve transferring oxygen from precursor layers (used to form or, more specifically, converted into resistance switching layers) to electrodes during annealing of the stacks. The annealing environment may include some hydrogen to control distribution of oxygen within the annealed structure.

As stated above, oxygen diffusion from the precursor layer into the electrode converts the precursor layer into a resistance switching layer. The precursor layer may include a stoichiometric oxide or near-stoichiometric oxide that cannot function as a resistance switching layer until oxygen vacancies or some other defects are formed within that layer. The metal of this oxide may be more electronegative than the metal of the electrode used to trap the oxygen diffused out of the precursor level. The electrode may have substantially no oxygen at least prior to the oxygen transfer but may form an oxide during annealing.

The stack may have a reactive electrode that receives some oxygen during annealing and inert electrode that generally does not participate in oxygen transfer. The inert electrode may be also referred to as an oxygen-resistant electrode and may be made from titanium nitride, tantalum nitride, platinum, gold, and the like. Other suitable materials for inert electrodes include various conductive oxide, such as iridium oxide and ruthenium oxide. In some embodiments, the inert electrode includes an oxide sub-layer facing the resistance switching layer. The rest of the electrode may be formed by the metal of this oxide and may be generally free of oxygen. For example, an initial structure may be fabricated from a metal and then pretreated to form an oxide layer resulting in an inert electrode. This electrode then receives a precursor layer and another reactive electrode formed over the precursor layer. During subsequent annealing, the inert electrode does not experience any significant oxygen transfer, while the reactive electrode receives oxygen from the precursor layer that is converted into the resistive switching oxide layer as it loses oxygen.

If an inert electrode with a protective oxide layer is a first formed electrode in the stack (i.e., the bottom electrode), then it can be first deposited as a metal layer followed by a short low-temperature anneal in oxygen. On the other hand, if an inert electrode is the last electrode formed in the stack (i.e., the top electrode), then its deposition can be initiated in the oxygen environment (e.g., sputtering in an oxygen-containing plasma) to form an initial oxide sub-layer followed by deposition in an inert environment to form the remaining metal (and oxygen free) portion of the electrode.

A reactive electrode can made from a material that reacts with oxygen to form a non-conductive oxide. Some examples of suitable materials include aluminum, titanium, tantalum, chromium, praseodymium, molybdenum, tungsten, and niobium.

A precursor layer may be made from materials, such as tantalum oxide ($Ta_2O_5$), niobium oxide ($Nb_2O_5$), titanium oxide ($TiO_2$), hafnium oxide ($HfO_2$), strontium titanate ($SrTiO_3$), or other suitable transition metal oxides, perovskite manganites, or rare earth oxides. The precursor layer may include a stoichiometric oxide or near-stoichiometric oxide. For example, oxygen vacancies in the precursor layer may have a concentration of less than 0.1 atomic percent prior to its annealing.

Annealing may be performed on a fully formed stack including two electrodes and precursor layer or a partially formed stack that includes only one electrode (the second electrode is formed after the annealing). Other types of layers may also be present in these stacks. As stated above, annealing performed at relative mild conditions to achieve better control over oxygen diffusion between one or more reactive layers and precursor layer. Annealing may form a graded composition of oxygen vacancies in the precursor layer.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

The interfaces can be inert interfaces or reactive interfaces. The inert interface generally does not have any substantial defect transfer through this interface. While the defects may be present within one or both layers forming this interface, these defects are not exchanged through the inert interface when switching, reading, or other types of voltages are applied to the ReRAM cell. The reactive interface generally experiences a transfer of defects through this interface. When a resistive switching layer includes an oxygen containing material, such as metal oxides, the reactive interface is formed by an oxygen reactive material, such as titanium nitride. The inert interface may be formed by a material that is not oxygen reactive, which may be a part of an electrode or a diffusion barrier layer. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when a switching voltage is applied to the resistive switching layer in order to reduce its resistance, the reactive interface allows defects to flow into the layer. The defects are typically driven by the electrical potential applied to the layer and form conductive paths through the layer. The direction of this flow may be determined by the polarity of the switching voltage and/or by the electrical charge of the defects (e.g., positive charged oxygen vacancies). At the same time, the second inert interface prevents defects from escaping the layer despite the driving potential. If both interfaces are reactive and allow defects to pass through, then the resistive switching layer may gain defects at one interface and loose at another. In this situation, the layer may never be able to gain enough defects to form conductive paths.

The above scenario is applicable in a very similar manner to a resetting operation during which the resistive switching layer is brought to its high resistance state. When a switching voltage is applied to the layer in order to increase its resistance of the layer, the reactive interface allows defects to flow out of the layer. The defects may also be driven by the electrical potential applied to the layer as described above. The loss of defects may eventually break conductive paths in the layer. At the same time, the second inert interface prevents defects from entering the layer despite the driving potential. If both interfaces are reactive and allow defects to pass through during the resetting operation, then the resistive switching layer may gain defects at one interface and loose at another. In this situation, the layer may never be able to loose enough defects in order to break it conductive paths. It should be noted that defects are often mobile in many times of resistive switching materials.

The ability of an interface to block defects (as in the inert interface) or to allow defects to diffuse through the interface (as in the reactive interface) depends on properties of a layer forming this interface together with the resistive switching layer. Often conductive electrodes are used to form both reactive and inert interfaces. These electrodes may be referred to as reactive and inert electrodes and materials used to form these electrodes may be referred to as reactive and inert materials. It should be noted that this terminology (i.e., reactive and inert) refers to primarily to defect mobility properties of the interfaces. Some examples of inert electrode materials include doped polysilicon, platinum, ruthenium, ruthenium oxide, gold, iridium, coppers, silver, and tungsten. Examples of reactive electrode materials include titanium nitride. Furthermore, some materials may be defined as semi-inert including tantalum nitride, tantalum silicon nitride, and tungsten silicon nitride. In the context of oxygen containing resistive switching materials, such as metal oxides, reactive materials may be also referred to as oxygen reaction materials since oxygen or oxygen vacancies are exchanged through the reactive interface. Titanium nitride is one example of oxygen reactive materials, however other examples may be used as well.

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1B:
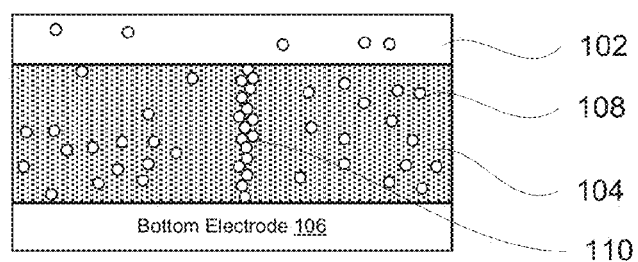
Figure 1C:
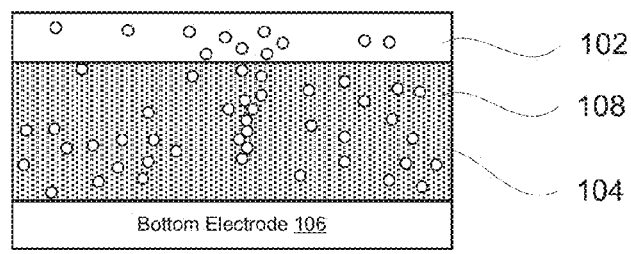

FIGS. 1A-1C illustrate a schematic representation of a ReRAM cell operation according to some embodiments. A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, electrically active defect (e.g. oxygen vacancy) 108, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Top electrode 102 and bottom electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature. Some of these mechanisms will be further described below with reference to FIGS. 1A-1C. In the described examples, top electrode 102 is reactive, while bottom electrode 106 is inert or is separated from resistive switching layer 104 by a diffusion barrier layer (not shown). One having ordinary skills in the art would understand that other arrangements are possible as well and within the scope of this disclosure.

Specifically, FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to the forming operation and all defects are provided from top electrode 102 during forming. Bottom electrode 106 may or may not have any defects. It should be noted that regardless of the presence or absence of defects in bottom electrode 106, substantially no defects are exchanged between bottom electrode 106 and resistive switching layer 104 during forming and/or switching operations.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths 110 as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage 104 is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or re-formed. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state, while the state illustrated in FIG. 1C is referred to as a high resistance state. The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Some examples of cells that exhibit unipolar switching behavior include resistive switching layers formed from most metal oxide and having inert electrodes at both sides, e.g., Pt/metal oxide (MeOx)/Pt. Alternatively, a voltage applied to electrodes 102 and 104 during the set operation may have different polarity as a voltage applied during the reset operation. This type of switching is referred to as bipolar switching. Some examples of cells that exhibit bipolar switching behavior include resistive switching layers formed from MeOx having one inert electrode and one reactive electrode, e.g., TiN/MeOx/Pt and TiN/MeOx/poly-Si. Setting and resetting operations may be repeated multiple times as will now be described with reference to FIGS. 2A and 2B.

Figure 2A:
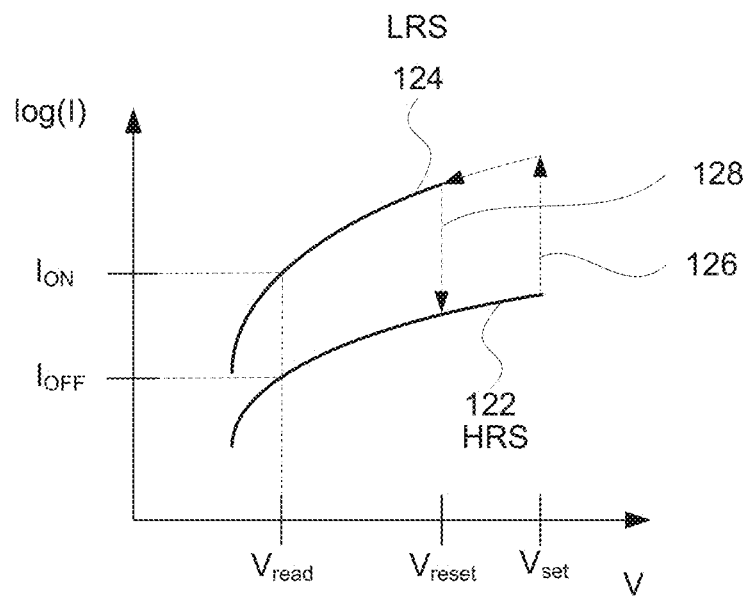
FIG. 2A illustrates a plot of a current passing through a unipolar switching ReRAM cell as a function of a voltage applied to the ReRAM cell, in accordance with some embodiments.
Figure 2B:
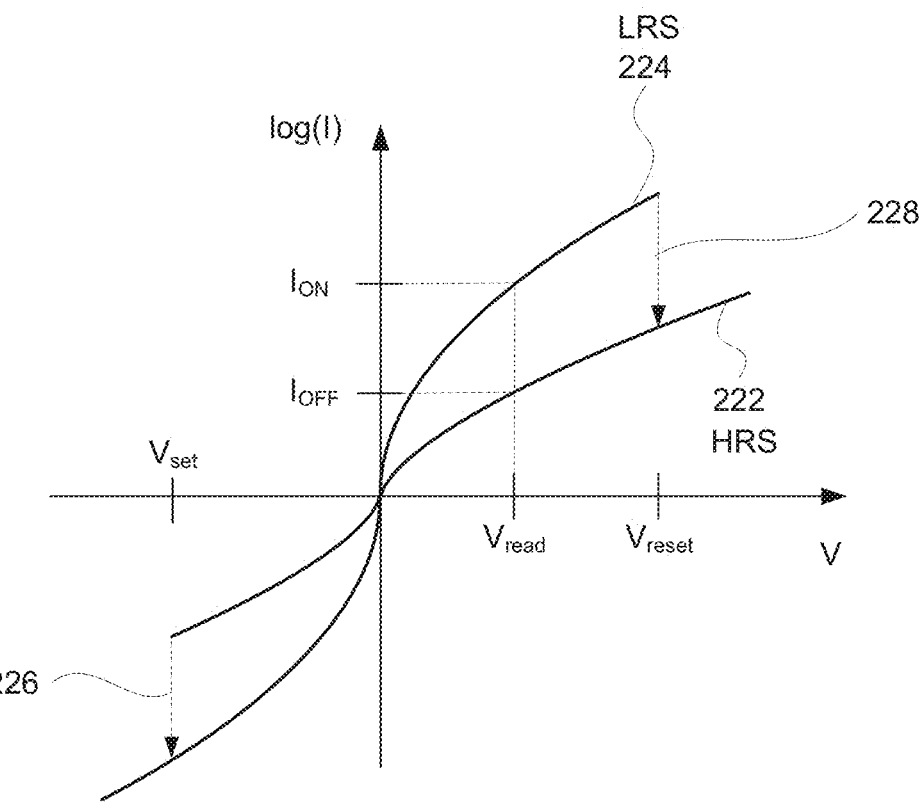
FIG. 2B illustrates the same type of a plot for a bipolar switching ReRAM cell, in accordance with some embodiments.

FIG. 2A illustrates a plot of a current passing through a unipolar switching ReRAM cell as a function of a voltage applied to the ReRAM cell, in accordance with some embodiments. FIG. 2B illustrates the same type of a plot for a bipolar switching ReRAM cell, in accordance with some embodiments. The HRS is defined by line 122, while the LRS is defined by 124 in FIG. 2A and by lines 222 and 224 respectively in FIG. 2B. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON"

by changing from its HRS to LRS), and reset operation (i.e., turning the cell "OFF" by changing from its LRS to HRS). During the read operation, the state of the ReRAM cell or, more specifically, the resistive state of its resistance of resistance switching layer can be sensed by applying a sensing voltage to its electrodes. The sensing voltage is sometimes referred to as a "READ" voltage or simply a reading voltage and indicated as $V_{READ}$ in FIGS. 2A and 2B. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistance switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistance switching layer. Switching from a LRS to HRS is indicated by dashed line 128 in FIG. 2A and line 228. Detecting the state of the ReRAM cell while it is in its HRS is described above.

It should be noted that polarity of the reset voltage and the set voltage may be the same as shown in FIG. 2A or different as shown in FIG. 2B. The cells that have the same polarity of set and reset voltages are referred to as unipolar cells, while the cells that have different polarities of h set and reset voltages are referred to as bipolar cells. Without being restricted to any particular theory, it is believed that unipolar switching occurs due to metallic filament formation and destruction caused by resistive heating and application of electrical field. Bipolar switching is believed to be based on filaments formed from oxygen vacancies. The formation and rupture of filament is done by oxygen vacancy moving back and forth. The switching voltages of unipolar and bipolar switching are typically comparable. However, the endurance of bipolar is generally better than that of unipolar.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

In some embodiments, the same ReRAM cell may include two or more resistance switching layers interconnected in series. Adjacent resistance switching layers may directly interface each other or be separated by an intermediate layer.

The ReRAM cells can be configured in a cross point memory array. The cross point memory arrays can include horizontal word lines that cross vertical bit lines. Memory cells can be located at the cross points of the word lines and the bit lines. The memory cells can function as the storage elements of a memory array.

Figure 3:
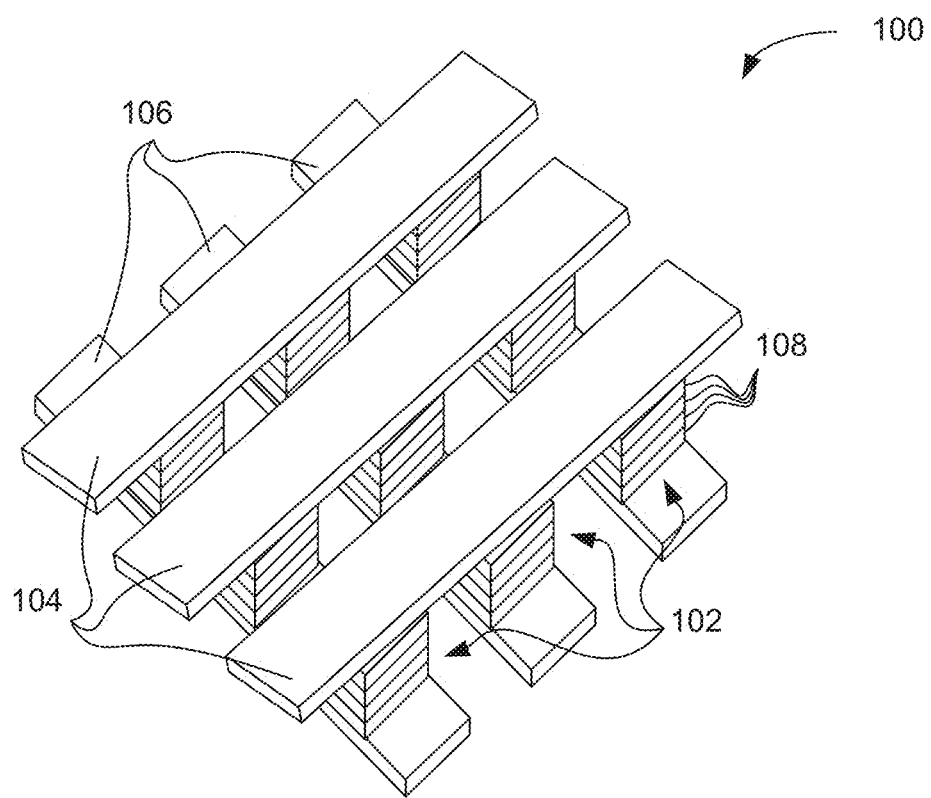
FIG. 3 illustrates a cross point memory array of resistive switching memory elements according to some embodiments.

FIG. 3 illustrates a cross point memory array of resistive switching memory elements according to some embodiments. Memory array 300 may be part of a memory device or other integrated circuit. Memory array 300 is an example of potential memory configurations; it is understood that several other configurations are possible.

Read and write circuitry may be connected to memory elements 302 using signal lines 304 and orthogonal signal lines 306. Signal lines such as signal lines 304 and signal lines 306 are sometimes referred to as word lines and bit lines and are used to read and write data into the elements 302 of array 300. Individual memory elements 302 or groups of memory elements 302 can be addressed using appropriate sets of signal lines 304 and 306. Memory element 302 may be formed from one or more layers 308 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 302. For example, horizontal and vertical lines 304 and 306 may be connected directly to the terminals of resistive switching memory elements 302. This is merely illustrative.

During the operation of the cross point memory array, such as a read operation, the state of a memory element 302 can be sensed by applying a sensing voltage (i.e., a "read" voltage) to an appropriate set of signal lines 304 and 306. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 304 and 306.

Ideally, only the selected memory cell, e.g., during a read operation, can experience a current. However, currents, often referred as sneak path currents, can flow through unselected memory elements during the read operation. The sensing the resistance state of a single memory call can be unreliable. For example, all memory cells in the array are coupled together through many parallel paths. The resistance measured at one cross point can include the resistance of the memory cell at that cross point in parallel with resistances of the memory cells in the other rows and columns.

Figure 4:
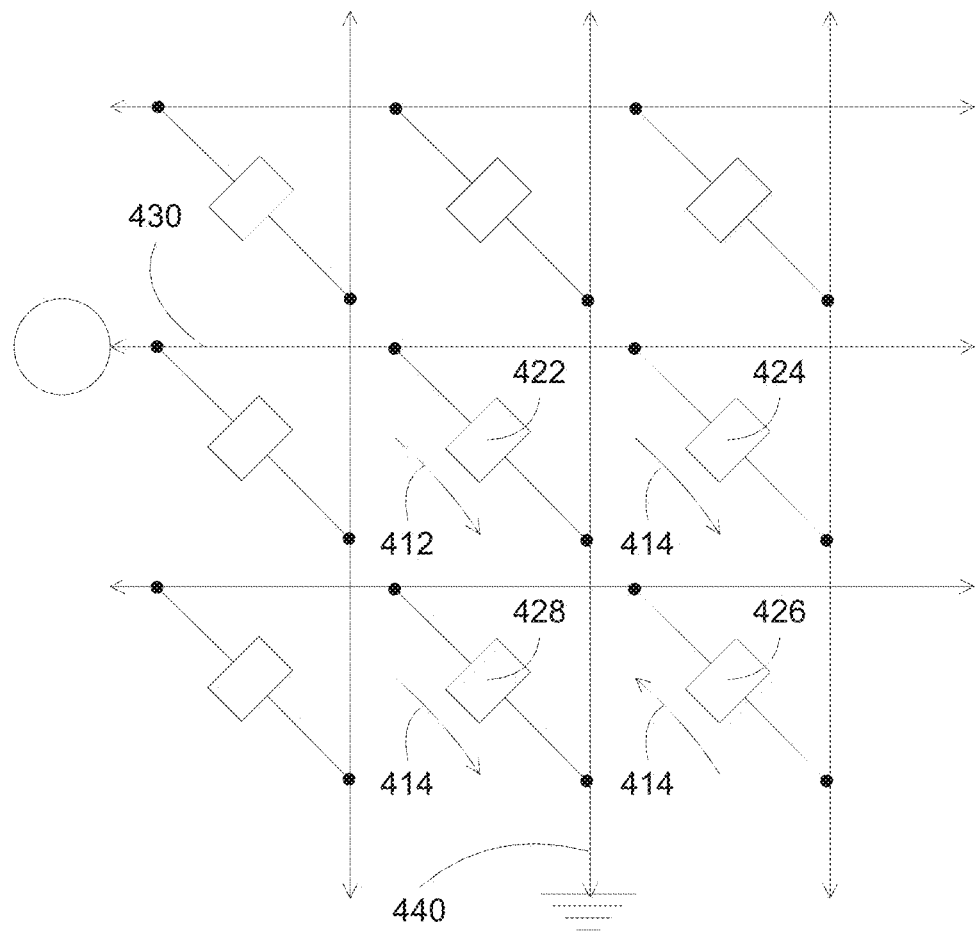
FIG. 4 illustrates sneak path currents in a cross point memory array according to some embodiments.

FIG. 4 illustrates sneak path currents in a cross point memory array according to some embodiments. A memory cell 422 can be selected, for example, for a read operation, by applying a voltage to signal line 430, and grounding signal line 440. A current can flow through the memory cell 422. However, parallel current paths, e.g., sneak path current, can exist, for example, represented by a series of memory cells 424, 426, and 428. The applied voltage (signal line 430) can generate a current 414 through memory cell 424, passing through memory cell 426, and returning to the ground (signal line 440) through memory cell 428.

There are multiple sneak path currents, and the resistances of the series memory cells can be smaller than that of the selected memory cell, thus can obscure the sense current through the selected memory cell during a read operation.

To reduce or eliminate the sneak path occurrence, a control device, e.g., a selector, can be used in the cross point memory array. For example, a series transistor or a diode can be located in a memory cell. The control device can isolate the selected memory cell from unselected memory cells by breaking parallel connections of the memory cells.

Figure 5:
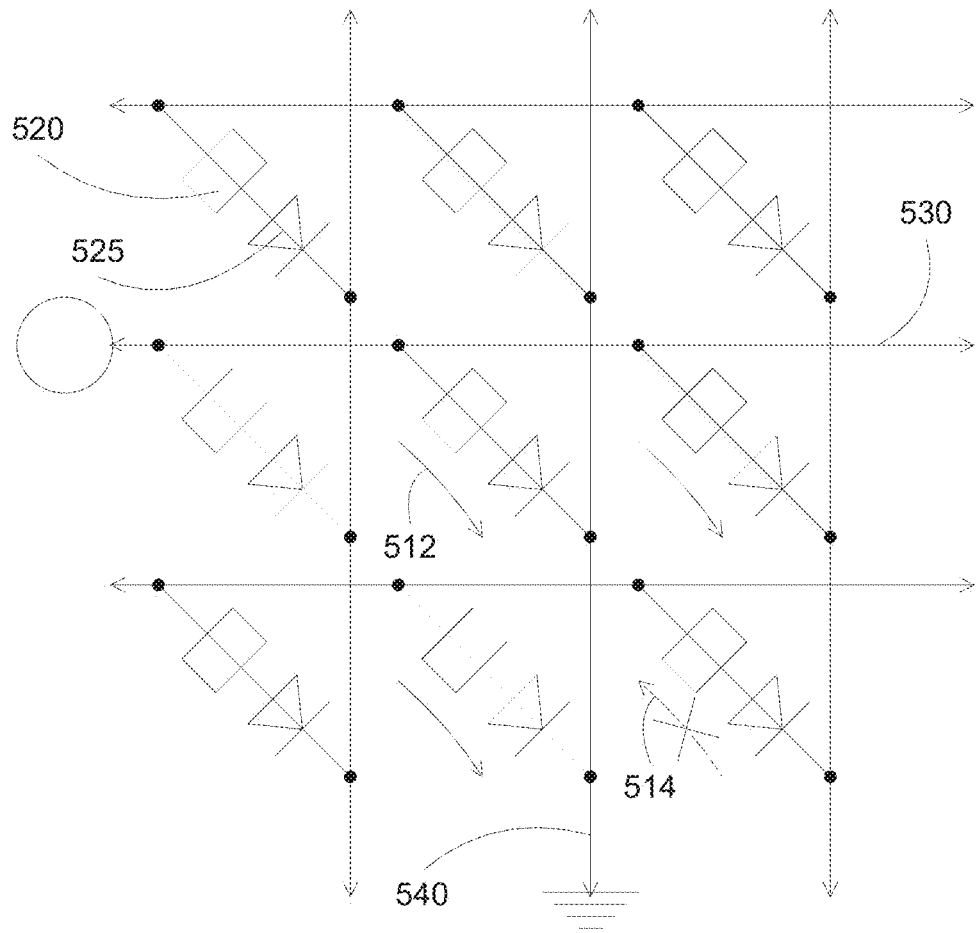
FIG. 5 illustrates a cross point memory array according to some embodiments.

FIG. 5 illustrates a cross point memory array according to some embodiments. A switching memory device can include a memory element 520 and a diode selector 525, which are both disposed between the electrodes 530 and 540. The diode selector 525 can be an intervening electrical component, disposed between electrode 530 and memory element 520, or between the electrode 540 and memory element 520. In some embodiments, the diode selector 525 may include two or more layers of materials that are configured to allow or inhibit the current flow in different directions through the memory element 520 when that memory element is not selected to read. For example, the diode selector can prevent a sneak path current 514 when the sense current 512 is generated.

Figure 6:
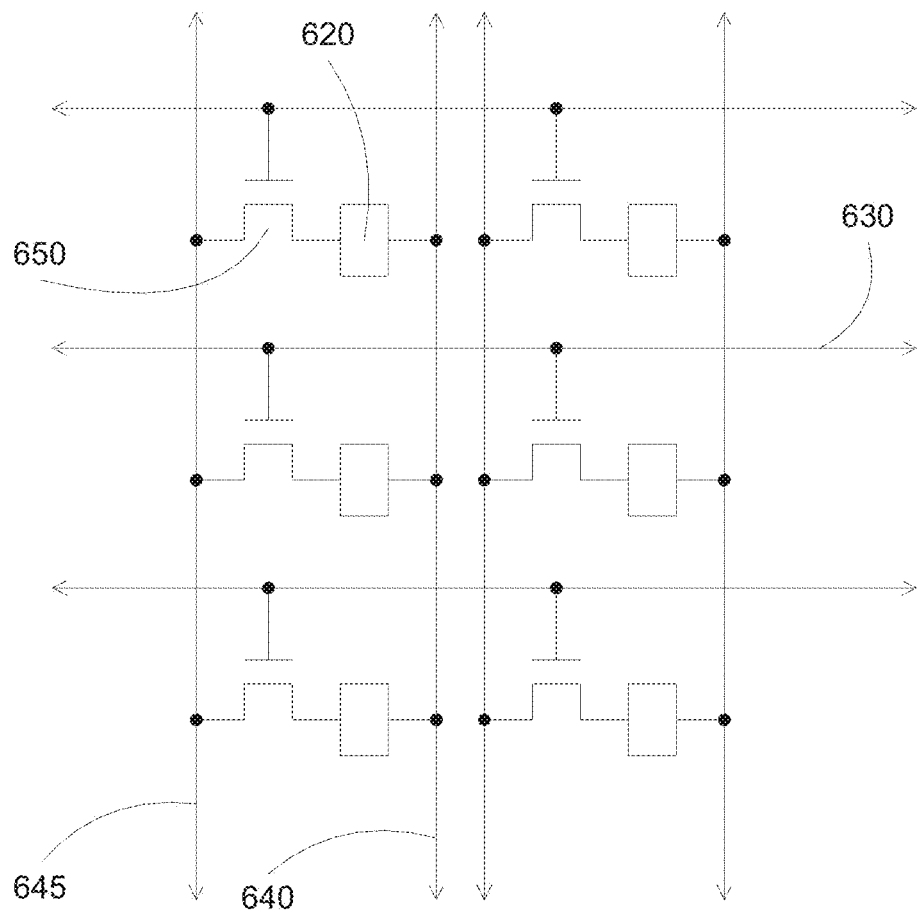
FIG. 6 illustrates an 1T1R NOR type memory array according to some embodiments.

For bipolar memory, the diode selector might not be suitable, since the voltage applied to the memory element can be at either polarity. A transistor selector can be used for isolating the memory element. FIG. 6 illustrates an 1T1R NOR type memory array according to some embodiments. A switching memory device can include a memory element 620, which can be disposed between the electrodes 640 and 645. The transistor selector 650 can be an intervening electrical component, disposed in series with the memory element 620 between electrode 640 and electrode 645. The transistor can be controlled by a control line 650 coupled to the gate of the transistor. A transistor can be turned by applying a voltage to the gate and the source or drain, e.g., control line 630 and electrode 645. The electrodes 640, electrodes 645 and control lines 630 can be biased by an external circuitry that is connected at the periphery of the memory array.

In some embodiments, a current limiter can be provided in series with the memory element to limit the current through the memory element, for example, during the set or reset operation.

A resistive memory element can require a minimum set current to cause the memory element to switch from a high resistance state, e.g., "0" state, to a low resistance state, e.g., "1" state. In practice, the difference between the applied set current and the minimum set current is much larger than necessary to cause the device to reliably switch to the logic "1" state, e.g., low resistance state. Further, it has been found that the magnitude of the current required to switch the memory element to a high resistance state from a low resistance state is dependent on the magnitude of the current used to set the device in the low resistance state. If a high set current is used, then a higher "reset" current is required to achieve a desirable high resistance state. In other words, the difference between the applied reset current and the minimum reset current also needs to be larger than necessary to cause the device to switch from the "1" to the "0" state if the magnitude of the prior applied set current is too far from the minimum set current.

The larger than necessary swings in the current used to switch between the "1" and "0" states can damage the materials and components in the switching memory device, thus affecting the memory element's lifetime and reliability.

In some embodiments, the current limiter can be provided so that its impedance can limit the current through the memory element to a value that is just greater than the minimum set current, and still allow the "1" logic state to be reliably set by the applied $V_{SET}$ voltage. It is believed that the current limiter can also help reduce the apparent minimum set current, since the current limiter impedance can reduce the swing in current between the set and reset switching currents at the same fixed applied voltage, thus affecting the density and movement of the traps in the variable resistance layer. Not intending to be bound by theory, but it is believed that when a smaller "1" state switching current is applied to a device that the formed filaments, or aligned traps, in the variable resistance layer will be smaller in size than if a higher "1" current is applied, thus making the filaments easier to alter during the reset phase of the resistive switching process.

Figure 7:
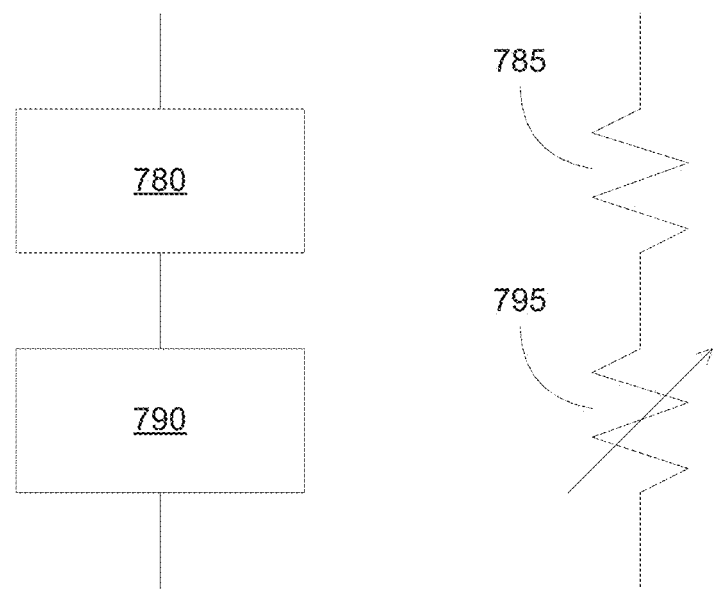
FIG. 7 illustrates an example of a current limiter circuit having non linear current response according to some embodiments.

FIG. 7 illustrates an example of a current limiter circuit having non linear current response according to some embodiments. A memory element 790 can be represented by a variable resistor. A current limiter circuit 780 can be represented by a resistor 785. By placing a current limiter 780 in series with a memory element 790, the set and reset currents can be reduced, leading to lower power consumption. Further, the low currents delivered to the memory element can reduce potential damages to the memory element, and also reduce the potential cross-talk between adjacently connected memory devices.

In some embodiments, methods and systems for reducing power consumption for memory arrays are provided. By reducing leakage current at the vicinity of zero voltage, the power efficiency of a memory array can be improved.

In some embodiments, methods and systems for lower current values through a memory element, for example, during a read operation or a set or reset operation, are provided. The current for the memory element can be significantly reduced at lower than the operating voltages, such as a read voltage, while still maintaining appropriate current at the operating voltages to avoid interfering with the memory device operations.

In some embodiments, methods and systems for a non linear reduction of current passing through a memory element are provided. At low voltages, e.g., lower than the operating voltages, the current can be significantly reduced, while the current can remain the same or can be controlled to ensure proper operation of the memory devices. The lower current values at low voltages can reduce power consumption and thus improve the power efficiency of the memory arrays. The lower current values at the operating voltages, e.g., set or reset operations, can also reduce power consumption and improving reliability for the memory array.

Figure 8A:
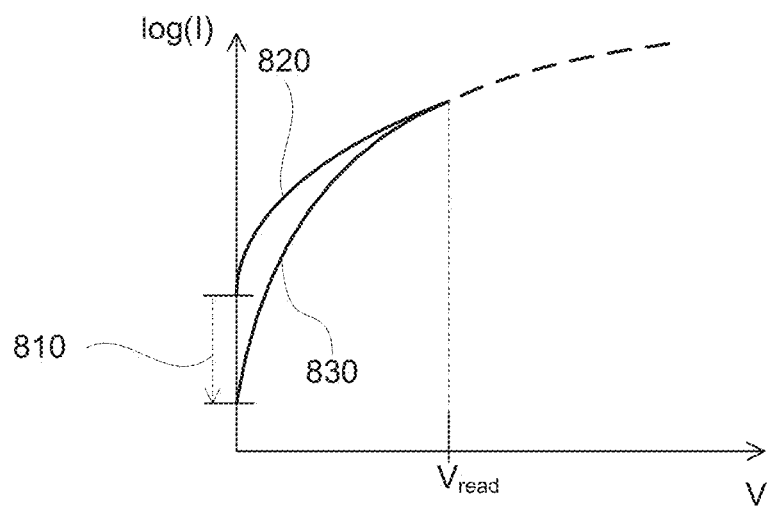
FIGS. 8A-8B illustrate an example of leakage current reduction for a unipolar switching according to some embodiments.
Figure 8B:
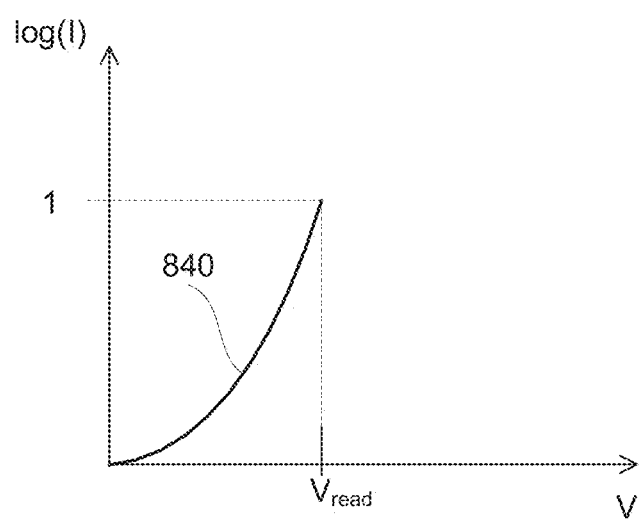

FIGS. 8A-8B illustrate an example of leakage current reduction for a unipolar switching according to some embodiments. In FIG. 8A, a current response, e.g., IV curve that is plotted on a linear V–log(I) graph, is shown. The current 820 can be a current response of a resistive memory element. The current 820 can rapidly increase from low current at zero voltage, and slowly increase until the operating voltage, such as the reading voltage $V_{read}$. The rapid increase of the current 820 at the vicinity of zero voltage can generate high leakage current, since voltage fluctuations can be present near zero voltage. In some embodiments, a reduction 810 of the current 820, especially near zero voltage, can reduce the leakage current. The current 820 can be the same at the operating voltage, e.g., $V_{read}$, so that the reading operation is not affected. A current curve 830 can thus provide power saving for the memory device without affecting its operations, by reducing the current near zero voltage and remaining the same at the operating voltage. FIG. 8B shows a possible transfer function 840, transforming current curve 820 to current curve 830, The transfer function 840 can include low current gain at low voltages, and unity current gain at operating voltages. As shown, the transfer function 840 can include a non linear response, starting at low slopes at low voltages and higher slopes at higher voltages.

Other current response curves can be used. For example, as shown, the modified current curve 830 approaches the original current curve 820 at the operating voltage $V_{read}$. Alternatively, the modified current curve 830 can approach the original current curve 820 at a voltage less than or higher than the operating voltage $V_{read}$.

Figure 9A:
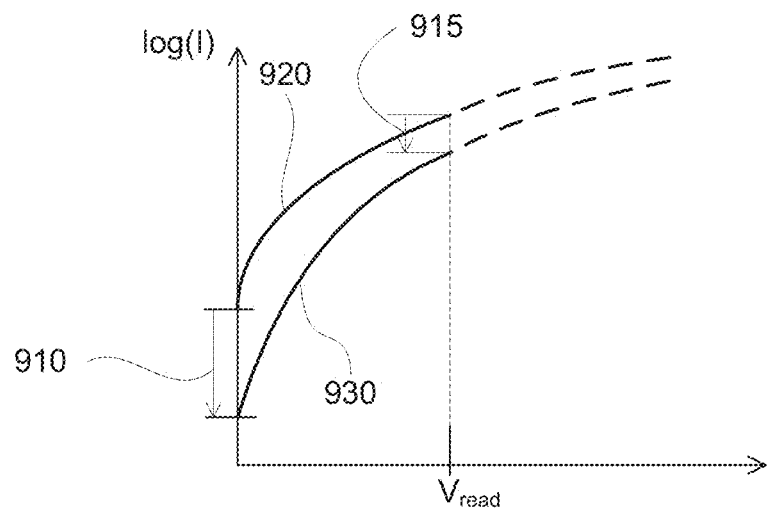
FIGS. 9A-9B illustrate an example of leakage current reduction for a unipolar switching according to some embodiments.
Figure 9B:
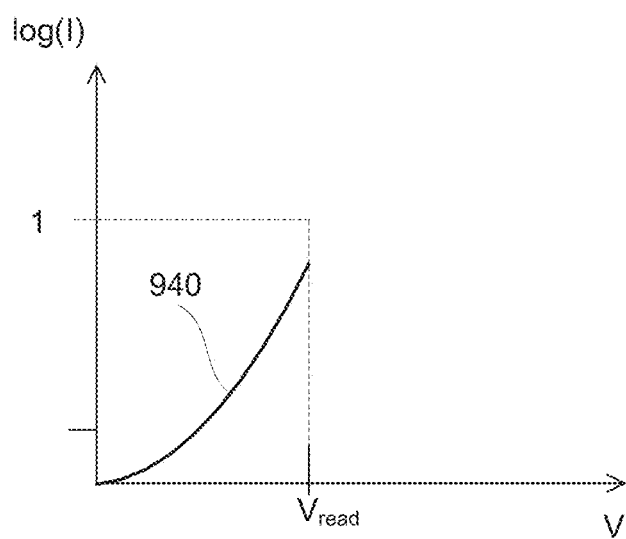

FIGS. 9A-9B illustrate an example of leakage current reduction for a unipolar switching according to some embodiments. The modified current curve can approach the original current curve at a voltage higher than $V_{read}$. In FIG. 9A, a current response, e.g., IV curve that is plotted on a linear V–log(I) graph, is shown. The current 920 can be a current response of a resistive memory element. In some embodiments, a reduction 910 of the current 920, especially near zero voltage, can reduce the leakage current. The current 920 can also be reduced, but at a much less amount 915 at the operating voltage, e.g., $V_{read}$, so that the reading operation is not affected. The current reduction at the operating voltage can serve as a current limiter, reducing surge and providing design control to the current response. A current curve 930 can thus provide power saving for the memory device, together with providing optimal current profiles for its operations, for example, by significantly reducing the current near zero voltage and controlling the current at the operating voltage. FIG. 9B shows a possible transfer function 940, transforming current curve 920 to current curve 930, The transfer function 940 can include low current gain at low voltages, and less than unity current gain at operating voltages. As shown, the transfer function 940 can include a non linear response, starting at low slopes at low voltages and higher slopes at higher voltages.

In some embodiments, methods and systems for a non linear reduction of current passing through a unipolar or a bipolar memory element are provided. The current can be significantly reduced at one voltage polarity (e.g., for unipolar memory device), or can be significantly reduced at both voltage polarities (e.g., for bipolar memory device). For example, the current can have high reduction at low positive voltage, and increasingly approach an operating current at Vread. The current can also have high reduction at low negative voltage, and increasingly approach (in the negative direction) an operating current at Vset.

Figure 10A:
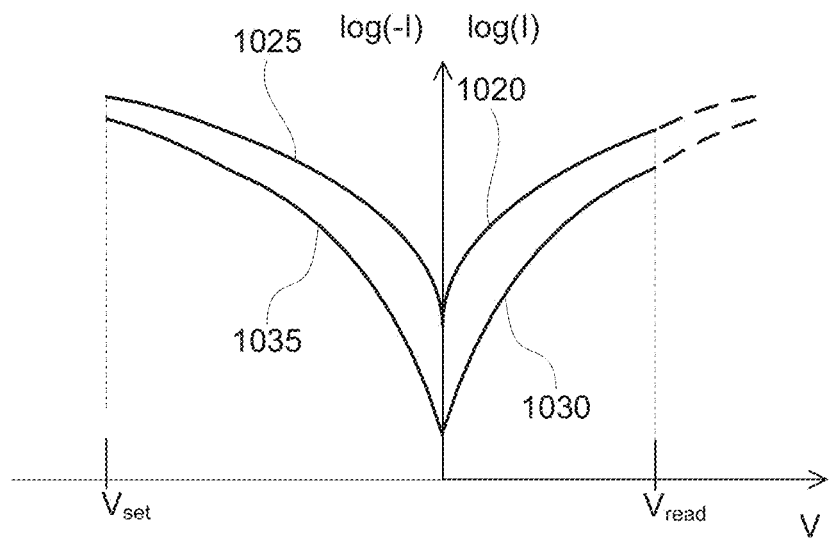
FIGS. 10A-10B illustrate an example of leakage current reduction for a bipolar switching according to some embodiments.
Figure 10B:
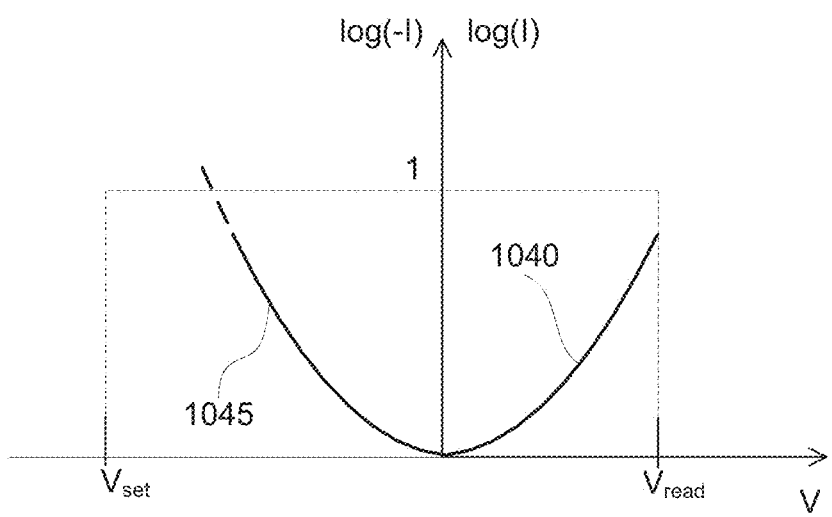

FIGS. 10A-10B illustrate an example of leakage current reduction for a bipolar switching according to some embodiments. The modified current curve can approach the original current curve at a voltage higher than $V_{read}$ in one polarity, e.g., positive voltage, and also can approach the original current curve at a voltage higher than $V_{set}$ in an opposite polarity, e.g., negative voltage. In FIG. 10A, current response for both voltage polarities is shown. The currents 1020 and 1025 can be a current response of a bipolar resistive memory element. In some embodiments, a reduction of the current 1020/1025, especially near zero voltage, can reduce the leakage current. The current 1020/1025 can also be reduced, but at a much less amount at the operating voltage, e.g., $V_{read}$ in one polarity and $V_{set}$ in an opposite polarity, so that the reading operation is not affected. Current curves 1030/1035 can thus provide power saving for the bipolar memory device, together with providing optimal current profiles for its operations, for example, by significantly reducing the current near zero voltage and controlling the current at the operating voltages, e.g, $V_{read}$ and $V_{set}$. FIG. 10B shows possible transfer functions 1040/1045, transforming current curve 1020 to current curve 1030 in one polarity, and transforming current curve 1025 to current curve 1035 in an opposite polarity, The transfer functions 1040/1045 can be symmetrical, and include a non linear response, starting at low slopes at low voltages and higher slopes at higher voltages.

Figure 11A:
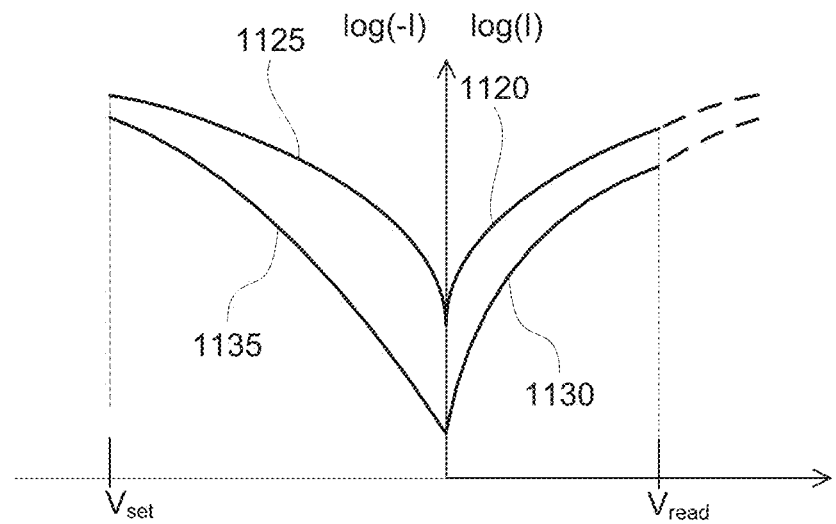
FIGS. 11A-11B illustrate an example of leakage current reduction for a bipolar switching according to some embodiments.
Figure 11B:
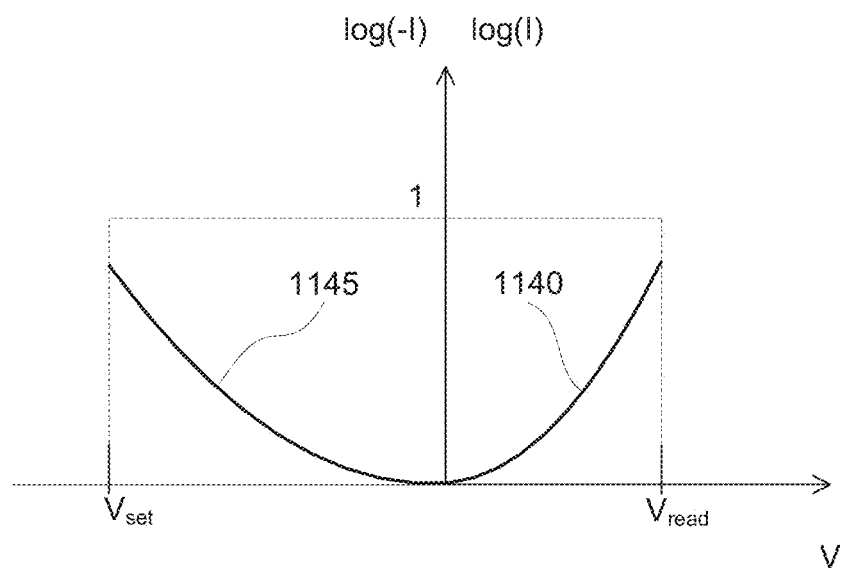

FIGS. 11A-11B illustrate an example of leakage current reduction for a bipolar switching according to some embodiments. In FIG. 11A, the modified current curve 1130 can approach the original current curve 1120 at a positive voltage higher than $V_{read}$. The modified current curve 1135 can approach the original current curve 1125 at a negative voltage higher (in magnitude) than $V_{set}$. The modified curves can be asymmetrical. In FIG. 11B, transfer functions 1140/1145 can transform current curve 1120 to current curve 1130 in one polarity, and transforming current curve 1125 to current curve 1135 in an opposite polarity, The transfer functions 1140/1145 can be asymmetrical, and include a non linear response, starting at low slopes at low voltages and higher slopes at higher voltages.

In some embodiments, methods and systems for optimizing the current response of a memory element are provided. By connecting a non linear IV response device in series to a resistive memory element, the current response of the memory element can be modified, for example, to reduce the leakage current at low voltages and to optimize the current at the operating voltages.

FIGS. 12A-12D illustrate examples of non linear IV response circuits according to some embodiments. The non linear IV response circuits can have low current gain at low voltages and high current gain at high voltages. The non linear IV response circuits can be connected to a memory element 1210. In FIG. 12A, the non linear IV response circuit can include two leaky PIN diodes 1220 and 1225 connected back to back. In FIG. 12B, the non linear IV response circuit can include two diodes 1230 and 1235 connected in parallel. In FIG. 12C, the non linear IV response circuit can include two Zener-type metal oxide diodes 1240 and 1245 connected back to back. In FIG. 12D, the non linear IV response circuit can include other circuitry that can provide a non linear response behavior, such as an ovonic threshold switching device 1250.

An ovonic threshold switch includes a material that can change resistance value based on an applied voltage. For example, when an applied voltage to an ovonic threshold switch material increases above a threshold value, the resistance value can drop to a much lower value. Typically, an ovonic threshold switch can be made from a phase change semiconductor material, such as a chalcogenic semiconductor material, having one single phase, which is generally amorphous, but can be crystalline. When an applied voltage to the ovonic threshold switch material increases above the threshold value, the number of free carriers in the semiconductor material increases suddenly, increasing the conductivity, e.g., lowering the resistance value. The resistance change can be large, for example, from 10 MOhm to 1 Ohm.

Alternatively, when the applied voltage falls below a holding voltage value, the resistance increases back to the original level. The ovonic switching behavior can be symmetrical and can occur for applying currents.

Figure 13A:
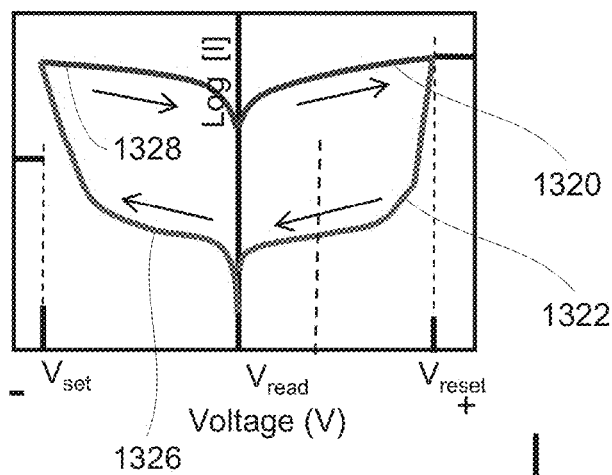
FIGS. 13A-13C illustrate a response of a memory device including a bipolar memory element and a non linear response circuit according to some embodiments.
Figure 13B:
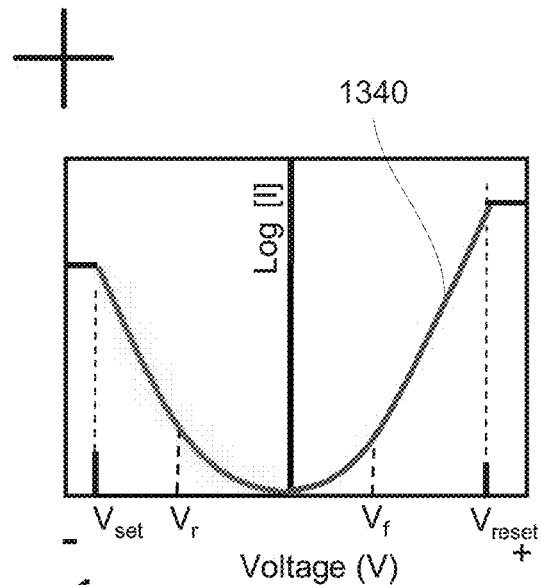
Figure 13C:
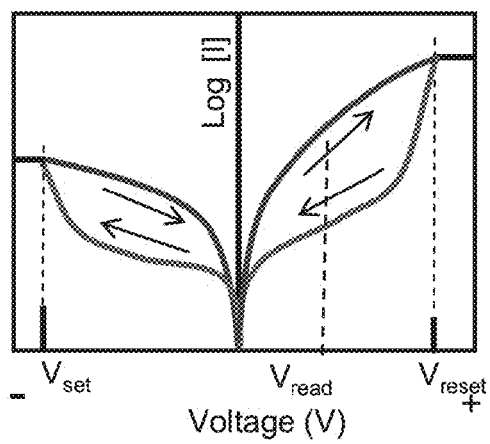

FIGS. 13A-13C illustrate a response of a memory device including a bipolar memory element and a non linear response circuit according to some embodiments. FIG. 13A shows an IV behavior of a memory element, including a reset operation to change the memory state from low resistance to high resistance, and a set operation to change the memory state from high resistance to low resistance. IV curve 1320 shows the behavior of the memory element when the applied voltage increases from zero to $V_{reset}$ in low resistance state. When the applied voltage reaches the reset voltage $V_{reset}$, the resistance increases, and the current drops to a much lower value (IV curve 1322). IV curve 1326 shows the behavior of the memory element when the applied voltage decreases from zero to $V_{set}$ in high resistance state. When the applied voltage reaches the set voltage $V_{set}$, the resistance decreases, and the current increases to a much higher value (IV curve 1328). When the memory is read, the applied voltage is $V_{read}$, which provides information about the resistance state of the memory device without changing its state. As shown, the current at the low voltages, especially near zero voltage, can be high, resulting in significant loss of power during the set, reset, or read operation.

By coupling the memory element to a non linear response circuit, the IV response of the memory element can be modified. In FIG. 13B, a non linear response circuit can include a response curve 1340 that includes low current response at low voltages and high current response at high voltages. For example, the response 1340 can include a concave shape, such as an exponential behavior or a diode behavior.

In FIG. 13O, the response result of the memory element and the non linear circuit can include IV current response with much lower current value, e.g., resulting in lower power consumption, near zero voltage. The IV current response does not affect the operation of the memory element, for example, by optimizing the non linear response to ensure that the currents at the operating voltages are appropriate for the device operation.

Figure 14A:
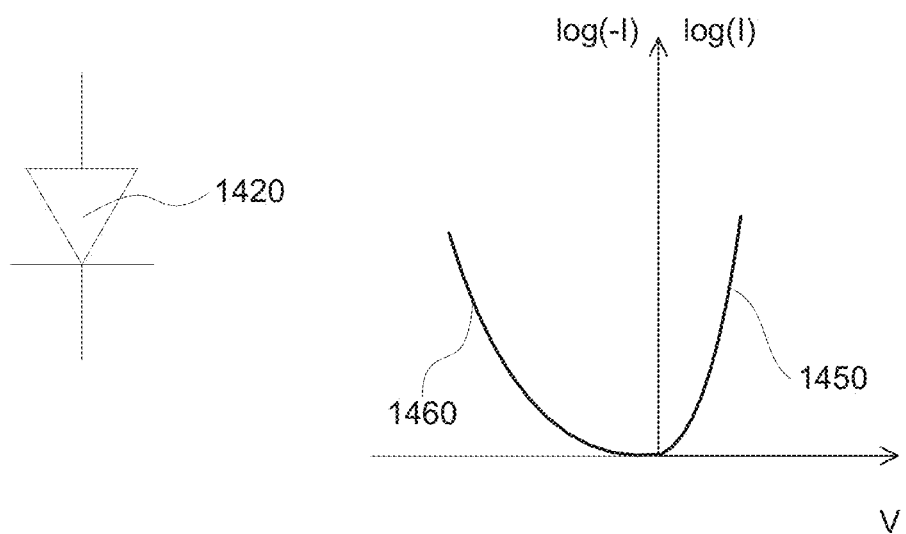
FIGS. 14A-14B illustrate an example response of a non linear circuit having leaky PIN diodes according to some embodiments.
Figure 14B:
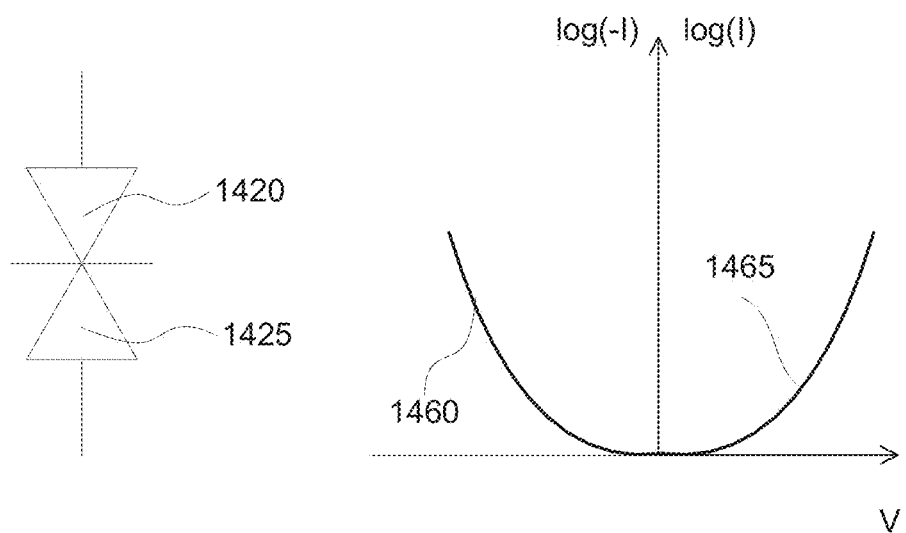

FIGS. 14A-14B illustrate an example response of a non linear circuit having leaky PIN diodes according to some embodiments. FIG. 14A shows the IV response of a leaky diode 1420. In a forward bias, the diode 1420 behaves like an on-switch, meaning the current can flow through the diode. Ideally, the current is infinity when V is positive. In practice, there can be internal resistance, and offset voltage, and thus the IV response for a forward diode can quickly increase as shown in curve 1450. In an ideal diode, there is no current in the reverse bias. However, the diode 1420 is a leaky diode, meaning there can be significant current flowing in the reverse bias, as shown in curve 1460. The two curves 1450 and 1460 are shown in different coordinates, for example, forward bias 1450 is shown in a log(I)/V graph, while the reverse bias 1460 is shown in a log(-I)/(-V) graph.

FIG. 14B shows a non linear circuit including two leaky PIN diodes 1420 and 1425 connected back to back. Since the two diodes are connected in series, the dominance response is the reverse bias, and thus the response of the non linear circuit includes the reverse bias responses of both leaky diodes, resulting in a non linear response behavior. If the two diodes are similar, the non linear response can be symmetrical. If the two diodes are different, for example, different levels of reverse current leakage, the non linear response can be asymmetrical.

Figure 15A:
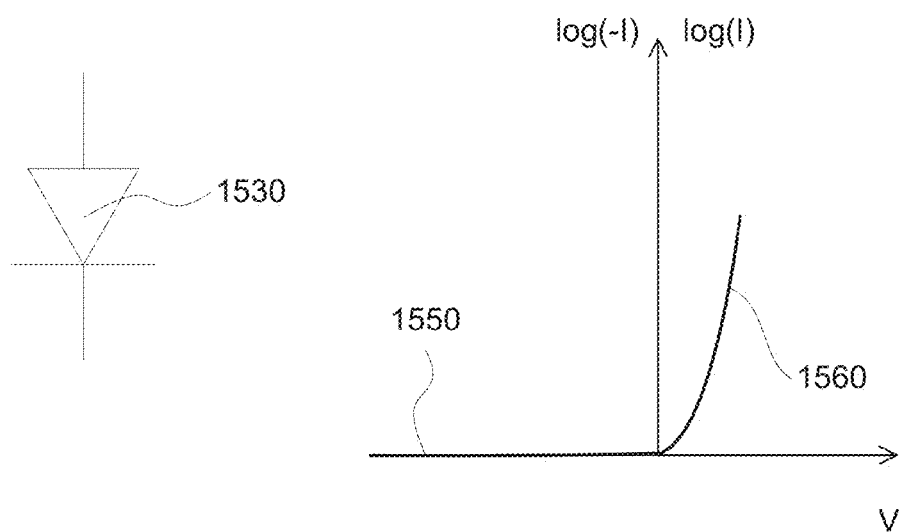
FIGS. 15A-15B illustrate an example response of a non linear circuit having parallel PIN diodes according to some embodiments.
Figure 15B:
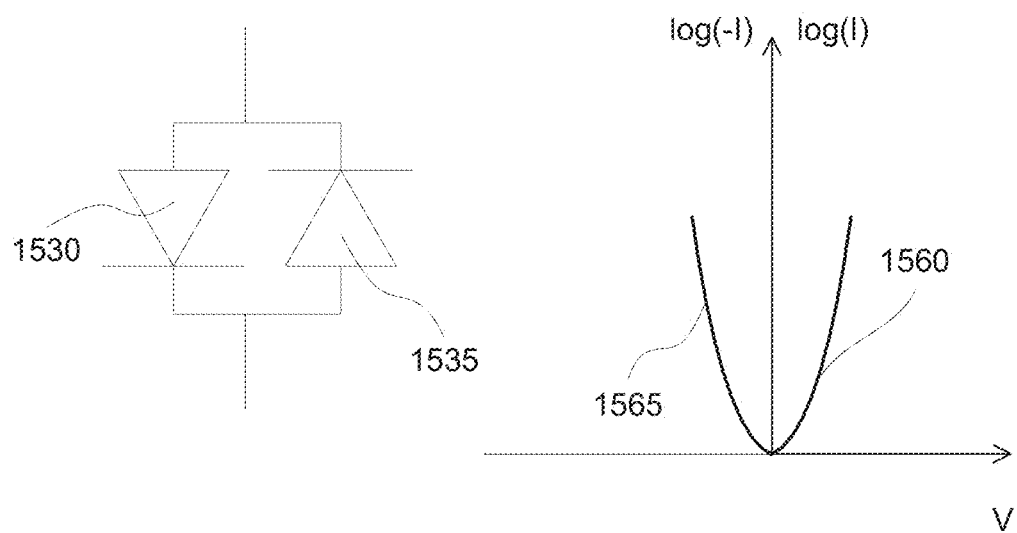

FIGS. 15A-15B illustrate an example response of a non linear circuit having parallel PIN diodes according to some embodiments. FIG. 15A shows the IV response of a diode 1530. In a forward bias, the diode 1530 behaves like an on-switch, meaning the current can flow through the diode. Ideally, the current is infinity when V is positive. In practice, there can be internal resistance, and offset voltage, and thus the IV response for a forward diode can quickly increase as shown in curve 1550. In an ideal diode, there is no current in the reverse bias.

FIG. 15B shows a non linear circuit including two PIN diodes 1530 and 1535 connected in parallel. Since the two diodes are connected in parallel, the dominance response is the forward bias, and thus the response of the non linear circuit includes the forward bias responses of both diodes, resulting in a non linear response behavior. If the two diodes are similar, the non linear response can be symmetrical. If the two diodes are different, for example, different levels of forward current behavior, the non linear response can be asymmetrical.

Figure 16A:
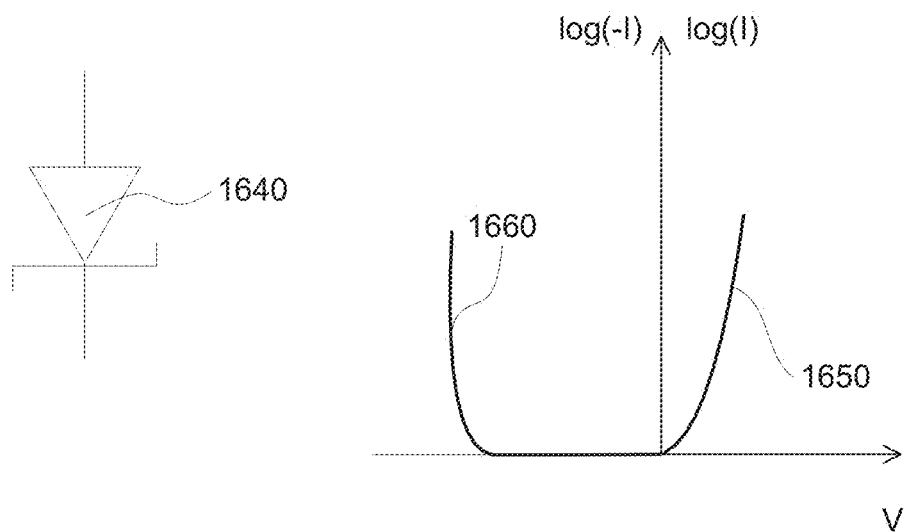
FIGS. 16A-16B illustrate an example response of a non linear circuit having Zener-type metal oxide diodes according to some embodiments.
Figure 16B:
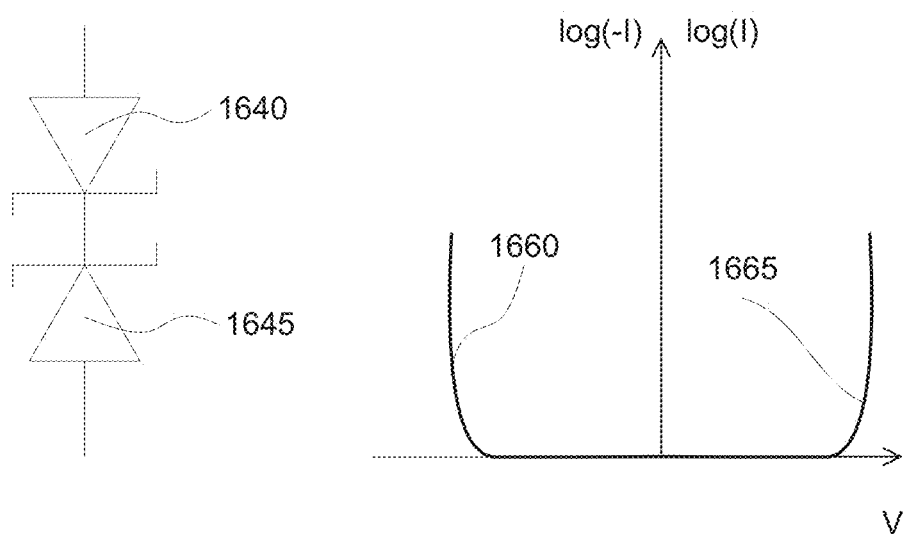

FIGS. 16A-16B illustrate an example response of a non linear circuit having Zener-type metal oxide diodes according to some embodiments. FIG. 16A shows the IV response of a Zener diode 1640. In a forward bias, the diode 1640 behaves like an on-switch, meaning the current can flow through the diode. Ideally, the current is infinity when V is positive. In practice, there can be internal resistance, and offset voltage, and thus the IV response for a forward diode can quickly increase as shown in curve 1650. In a Zener diode, there is no current in the reverse bias until reaching a Zener voltage. At Zener voltage, the current can be substantially constant.

FIG. 16B shows a non linear circuit including two Zener-type metal oxide diodes 1640 and 1645 connecting back to back. Since the two diodes are connected in series, the dominance response is the reverse bias, and thus the response of the non linear circuit includes the reverse bias responses of both Zener diodes, resulting in a non linear response behavior. If the two diodes are similar, the non linear response can be symmetrical. If the two diodes are different, for example, different levels of reverse current leakage, the non linear response can be asymmetrical.

In some embodiments, the memory device including a memory element and a non linear response circuit can be used in a memory array, such as a cross point array. For example, the non linear response circuit can be fabricated on the memory element, forming a columnar memory device, which can be placed at the cross points of the word lines and bit lines.

Figure 17:
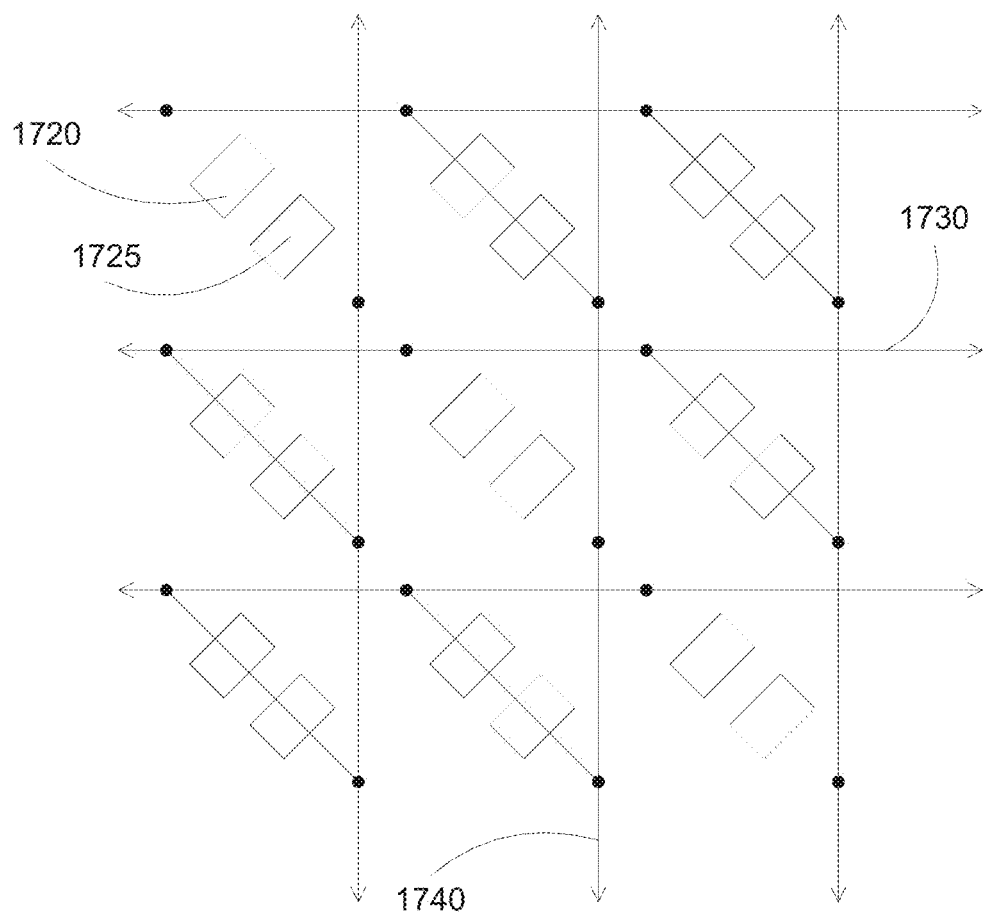
FIG. 17 illustrates a cross point memory array according to some embodiments.

FIG. 17 illustrates a cross point memory array according to some embodiments. A switching memory device can include a memory element 1720 and a non linear response circuit 1725, which are both disposed between the electrodes 1730 and 1740. The non linear response circuit 1725 can be an intervening electrical component, disposed between electrode 1730 and memory element 1720, or between the electrode 1740 and memory element 1720. In some embodiments, the non linear response circuit 1725 may include two or more layers of materials that are configured to provide a non linear response as discussed above.

Figure 18:
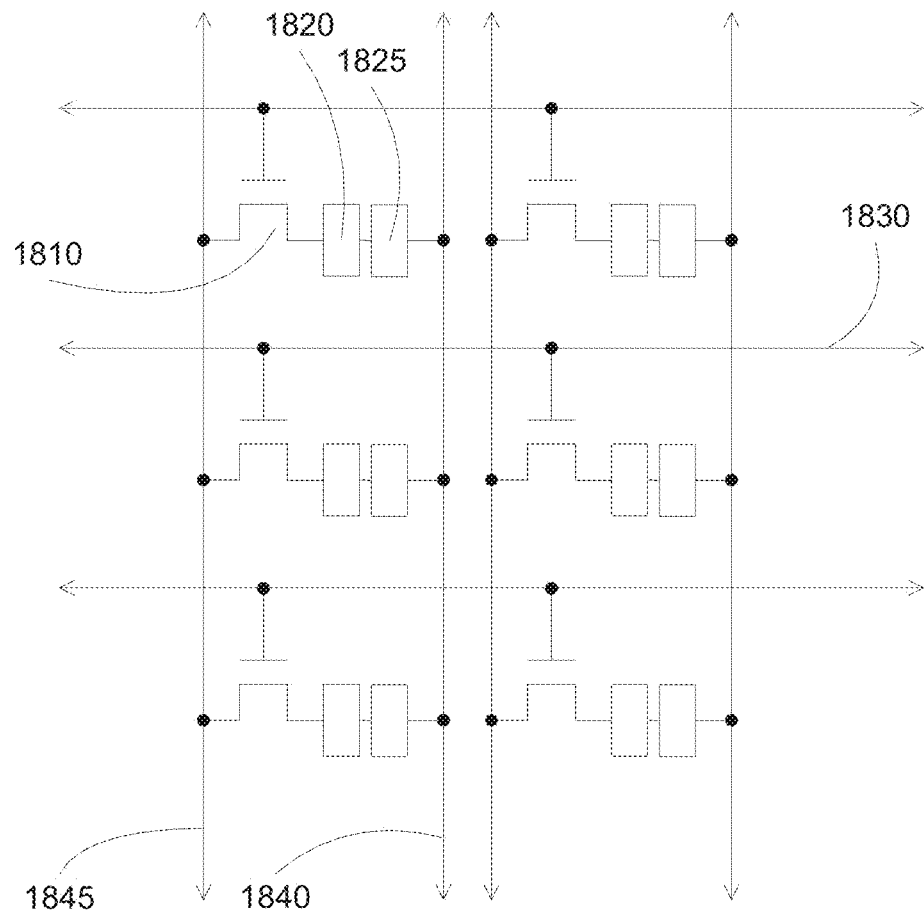
FIG. 18 illustrates a cross point memory array for a separate storage line according to some embodiments.

FIG. 18 illustrates a cross point memory array for a separate storage line according to some embodiments. A switching memory device can include a memory element 1820 and a non linear response circuit 1825, which are both disposed between the electrodes 1840 and 1845. A selector device, such as a transistor 1810, can be used to isolate the memory devices, for example, through the control lines 1830.

Figure 19:
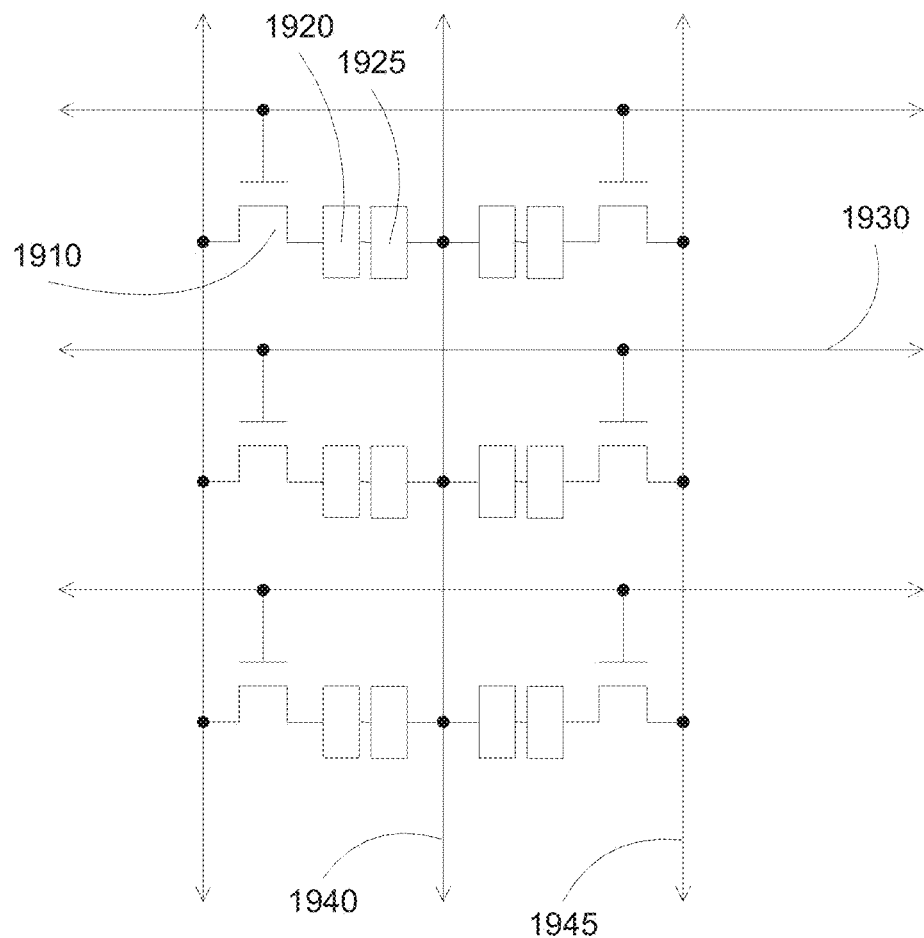
FIG. 19 illustrates another cross point memory array for a shared storage line according to some embodiments.

FIG. 19 illustrates another cross point memory array for a shared storage line according to some embodiments. The memory devices can be connected back to back, sharing electrodes 1940 and 1945. Control lines 1930 can be used to turn on transistor 1910, to select memory element 1920 and non linear response circuit 1925.

The transistor configurations can include a planar transistor, a vertical pillar transistor, a 3D FinFET device, or any other types of transistor devices.

Figure 20:
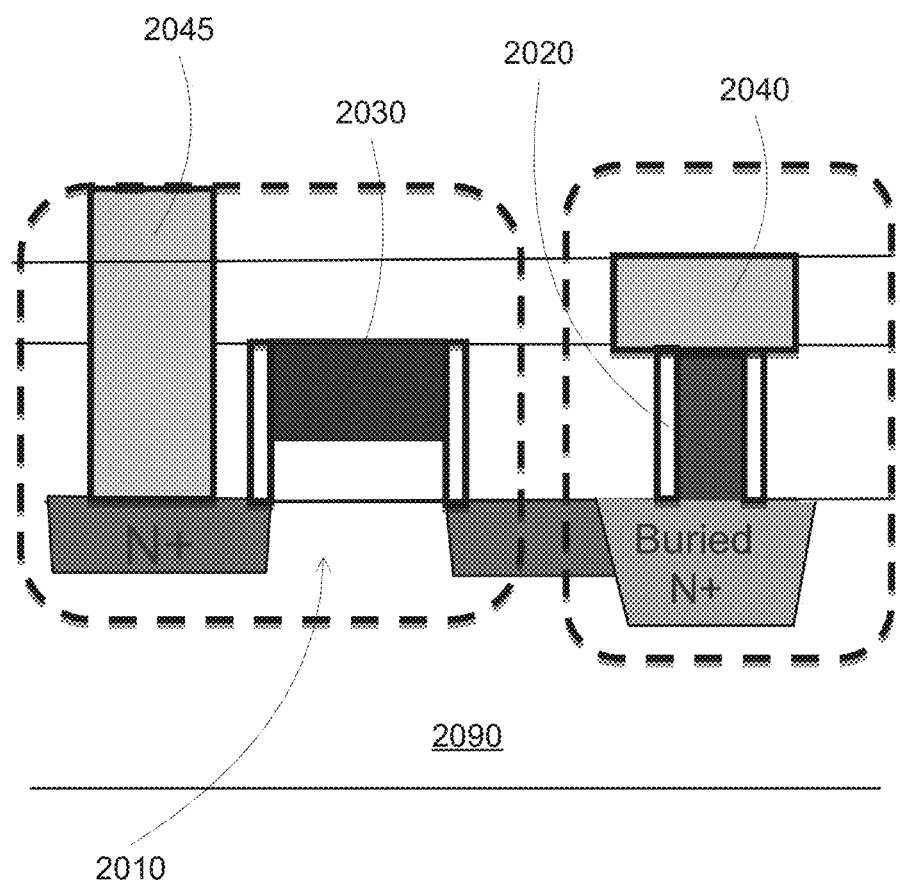
FIG. 20 illustrates an example of an embedded memory cell according to some embodiments.

FIG. 20 illustrates an example of an embedded memory cell according to some embodiments. A transistor structure 2010 is formed on a substrate 2090, including isolation regions to isolate the neighboring devices, source and drain regions sandwiching a gate electrode having a gate dielectric and a gate conductor. Spacers can cover the sidewalls of the gate electrode. The substrate can be a semiconductor substrate, or any substrate having a layer of semiconductor layer. For example, the substrate can be a single crystal silicon substrate. The substrate can be a silicon-germanium substrate, or can have a silicon germanium layer disposed on top for enhancing a channel mobility. The substrate can also be a germanium substrate, or a silicon carbide substrate for a high switching voltage operation. The gate conductor can include doped polysilicon or metal stacked on a high-k gate dielectric material. A metal-oxide-semiconductor field effect transistor (MOSFET) structure is shown, but the invention is not so limited, and can include any transistor structure, such as bipolar transistors. In addition, the process flow can include a silicidation process for gate electrode and on source and drain regions.

A bit line 2045 can be connected to the source (or drain) of the transistor, for example, through a via contact, to form parallel bit lines of a cross point array. A word line 2030 can be connected to the gate electrode, for example, through a via contact, to form parallel control lines of the cross point array. A memory device 2020, including a memory element and a non linear response circuit, can be connected to the drain (or source) of the transistor. The memory device can also be connected to a storage line 2040, for example, to form parallel storage lines of the cross point array.

Figure 21:
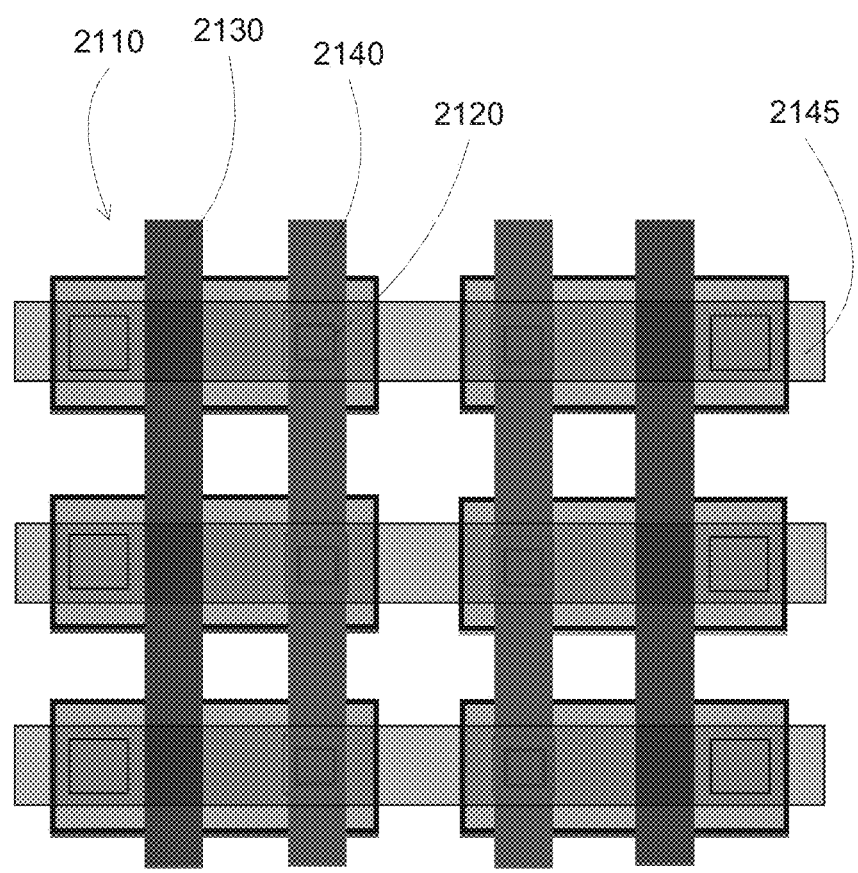
FIG. 21 illustrates a top view of a circuit layout for an embedded memory array using a planar transistor according to some embodiments.

FIG. 21 illustrates a top view of a circuit layout for an embedded memory array using a planar transistor according to some embodiments. Multiple word lines 2130 and storage line 2140 can be placed in parallel, intersecting multiple bit lines 2145. Via contacts can be included to connect the sources or drains and the gates of the transistors 2010 to the bit lines and the word lines, respectively. A memory device 2120 can be placed at the intersection of the storage lines 2140 and the source or drain contact of the transistor 2010.

Figure 22:
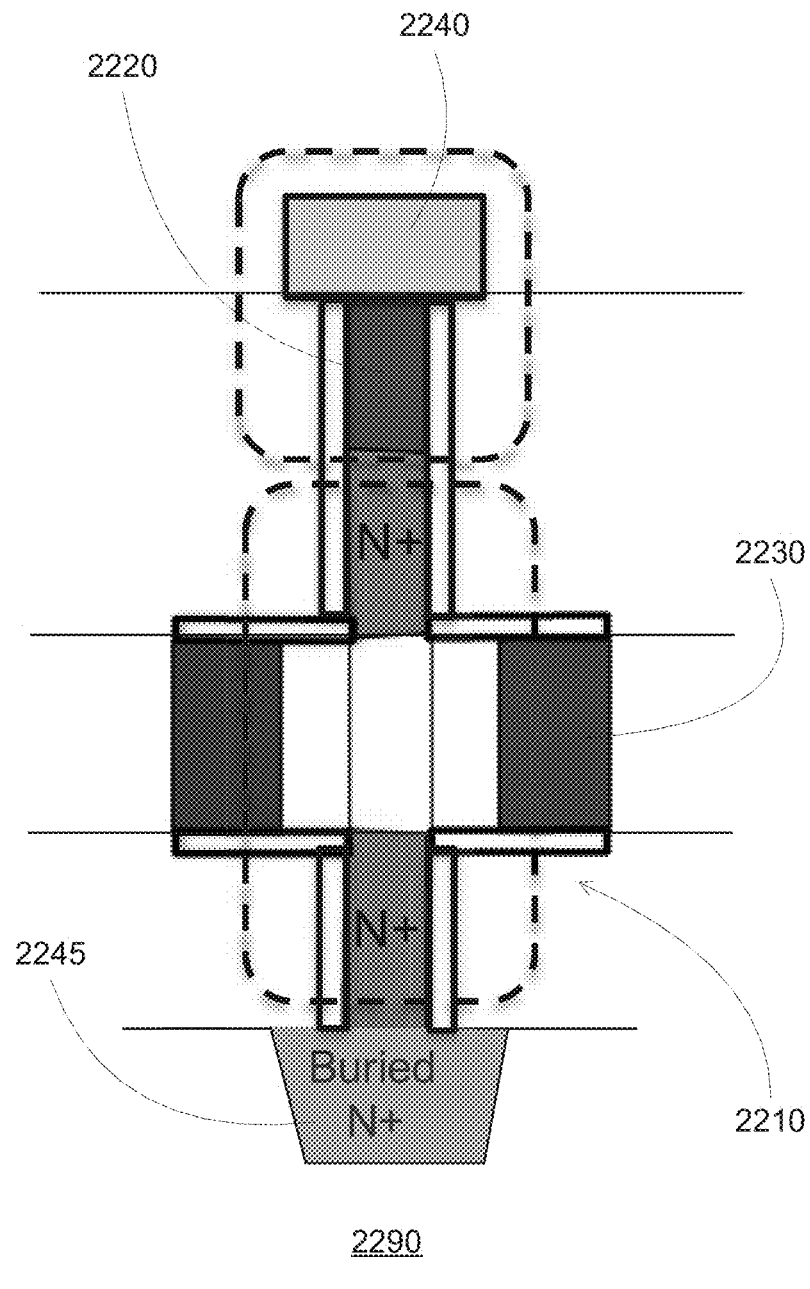
FIG. 22 illustrates an example of an embedded memory cell using a pillar transistor according to some embodiments.

FIG. 22 illustrates an example of an embedded memory cell using a pillar transistor according to some embodiments. A vertical pillar transistor structure 2210 and a memory device 2220 can be formed on a substrate 2290, including isolation regions to isolate the neighboring devices, source and drain regions sandwiching a gate electrode having a gate dielectric and all around circular gate conductor. Spacers can cover the sidewalls of the gate electrode. A transistor can be vertical constructed, reducing the areas of the memory cell and the selector devices for a highly compact embedded memory cell.

A bit line 2245 can be connected to the source (or drain) of the transistor to form parallel bit lines of a cross point array through buried n+ line in substrate. A word line 2230 can be connected to the gate electrode to form parallel word lines of the cross point array. The memory device can also be connected to a storage line 2240 to form parallel word lines of the cross point array.

Figure 23:
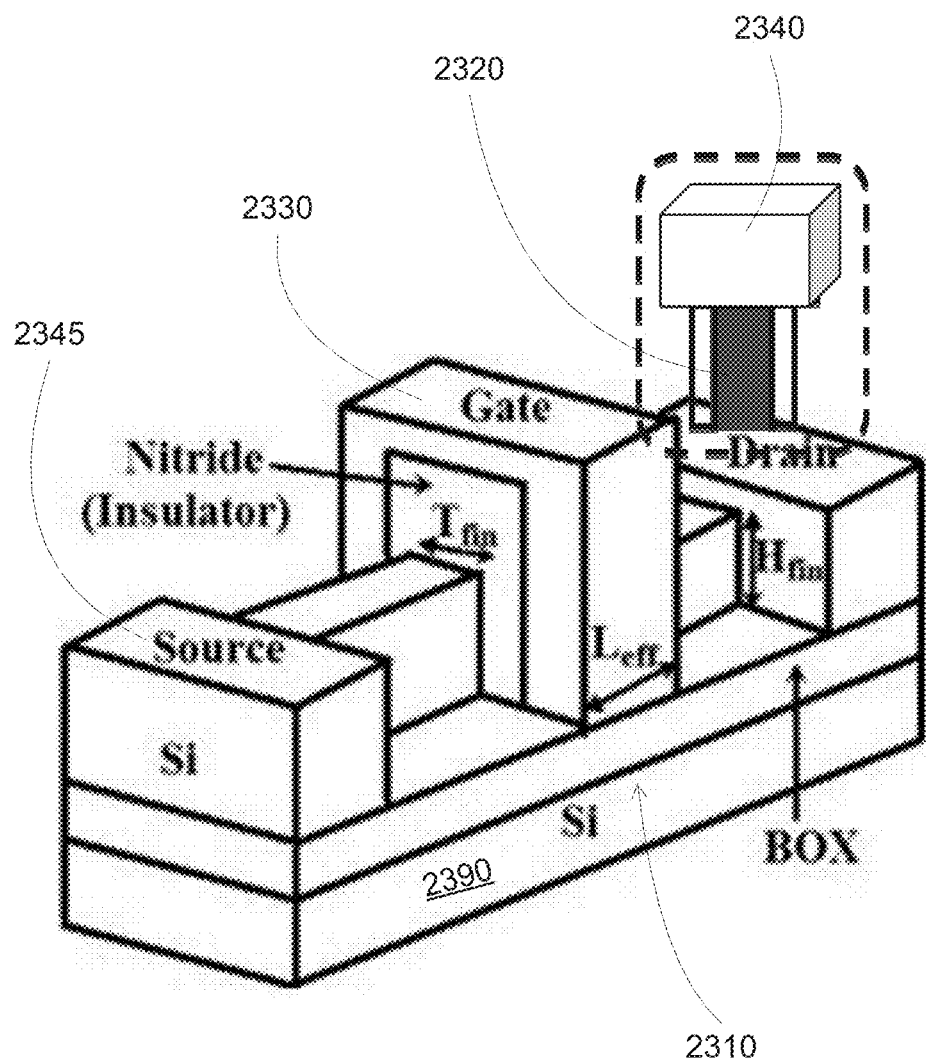
FIG. 23 illustrates an example of an embedded memory cell using a 3D FinFET according to some embodiments.

FIG. 23 illustrates an example of an embedded memory cell using a 3D FinFET according to some embodiments. A finFET device 2310 having a semiconductor body having a fin shape formed on buried oxide layer (BOX) in a substrate 2390. Source/drain regions can be formed at opposite ends of the semiconductor body. A gate dielectric can be formed on a portion between the source and drain regions, which becomes a channel region of the FinFET device. A gate electrode can be formed on the gate dielectric. The source/drain regions can be doped, for example, with p-type or n-type dopants to form p-type or n-type devices. The doping of the source/drain regions can be accomplished by a low energy plasma doping, using the gate electrode to act as a mask to prevent the channel region from being doped. As shown, the gate dielectric and the gate electrode surround the channel on two sides, forming a double-gate finFET device. Alternatively, a tri-date FinFET device can be formed if the gate dielectric and the gate electrode are present at three sides, e.g., left, right, and top sides.

A bit line 2345 can be connected to the source (or drain) of the transistor to form parallel bit lines of a cross point array. A word line 2330 can be connected to the gate electrode to form parallel control lines of the cross point array. The memory device 2320 can also be connected to a storage line 2340 to form parallel storage lines of the cross point array.

Although the foregoing examples have been described in some details for purposes of clarity of understanding, the invention is not limited to the details provided. There are many alternative ways of implementing the invention. The disclosed examples are illustrative and not restrictive.

What is claimed is:

1. A memory device comprising
   a resistive memory element,
      wherein the resistive memory element is operable to switch from a first resistance state to a second resistance state based on a first applied voltage,
      wherein the resistive memory element is operable to switch from the second resistance state to the first resistance state based on a second applied voltage,
      wherein the first applied voltage is opposite in polarity to the second applied voltage;
   a non linear response circuit serially coupled with the resistive memory element,
      wherein the non linear response circuit comprises two leaky PIN diodes connected back in series,
         wherein each of the two leaky PIN diodes comprises an undoped intrinsic semiconductor region between a doped p-type semiconductor region and a doped n-type semiconductor region, wherein the non linear response circuit is configured to have a first current gain at first set of voltages and second current gain at second set of voltages, wherein the first current gain is smaller than the second current gain, wherein the absolute values of the first set of voltages are smaller than the absolute values of the second set of voltages, and a transistor, wherein the transistor is operable as a selector device for the memory element.

2. A memory device as in claim 1, wherein the non linear response circuit reduces a current passing the memory element at an operating voltage.

3. A memory device as in claim 1, wherein the non linear response circuit is further operable as a current limiter for the memory element.

4. A memory device as in claim 1, wherein the transistor comprises a planar transistor or a vertical transistor.

5. A memory device as in claim 1, wherein the transistor comprises a fin planar transistor.

6. A memory device as in claim 1, wherein the first set of voltages is ranged from zero to more than half of the first applied voltage or to more than half of the second applied voltage, wherein the second set of voltages is ranged from less than half of the first applied voltages to the first applied voltage or from less than half of the second applied voltages to the second applied voltage.

7. A memory device as in claim 1, wherein the transistor is coupled to the memory element, and wherein the memory element is coupled to the non linear response circuit, or wherein the transistor is coupled to the non linear response circuit, and wherein the non linear response circuit is coupled to the memory element.

8. A memory array comprising a plurality of first conductive lines;

a plurality of second conductive lines, wherein the plurality of second conductive lines is substantially parallel to the plurality of first conductive lines;

a plurality of third conductive lines, wherein the plurality of third conductive lines forms an angle with the plurality of first conductive lines;

a plurality of resistive memory devices, wherein each of the plurality of resistive memory device comprises a resistive memory element, wherein the resistive memory element is operable to switch from a first resistance state to a second resistance state based on a first applied voltage, wherein the resistive memory element is operable to switch from the second resistance state to the first resistance state based on a second applied voltage, wherein the first applied voltage is opposite in polarity to the second applied voltage;

a non linear response circuit serially coupled with the resistive memory element, wherein the non linear response circuit comprises two leaky PIN diodes connected back to back in series, wherein each of the two leaky PIN diodes comprises undoped intrinsic semiconductor region between a doped p-type semiconductor region and a doped n-type semiconductor region, wherein the non linear response circuit is configured to have a first current gain at first set of voltages and second current gain at second set of voltages, wherein the first current gain is smaller than the second current gain, wherein the absolute values of the first set of voltages are smaller than the absolute values of the second set of voltages, wherein either the resistive memory element or the non linear response circuit is coupled to one of the plurality of first conductive lines, the plurality of second conductive lines, or the plurality of third conductive lines, a transistor comprising a gate electrode, a source electrode and a drain electrode, wherein the transistor is operable as a selector device for the memory element, wherein the gate electrode is coupled to one of the plurality of the first conductive lines, the plurality of second conductive lines, or the plurality of third conductive lines, wherein the source or drain electrode of the transistor is coupled to one of the plurality of first conductive lines, the plurality of second conductive lines, or the plurality of third conductive lines, wherein the drain or source electrode of the transistor is coupled to either the non linear response circuit or the resistive memory element.

9. A memory array as in claim 8 wherein the non linear response circuit reduces a current passing the memory element at an operating voltage.

10. A memory array as in claim 8, wherein the first set of voltages is ranged from zero to more than half of the first applied voltage or to more than half of the second applied voltage, wherein the second set of voltages is ranged from less than half of the first applied voltages to the first applied voltage or from less than half of the second applied voltages to the second applied voltage.

11. A memory array as in claim 8, wherein the transistor comprises one of a planar CMOS transistor, a vertical pillar transistor, or a 3D fin-shaped field effect transistor.

12. The memory array of claim 8, wherein the resistive memory element is operable as a metallic switching device serially connected to a memory stack and is formed with a high productivity combinatorial (HPC) material section.

13. The memory array of claim 8, further comprising horizontal word lines that cross vertical bit lines.

14. The memory array of claim 8, wherein spacers cover sidewalls of the gate electrode.

* * * * *